United States Patent [19]

Miki et al.

[11] Patent Number: 5,396,131
[45] Date of Patent: Mar. 7, 1995

[54] DIFFERENTIAL AMPLIFIER, COMPARATOR AND HIGH-SPEED A/D CONVERTER USING THE SAME

[75] Inventors: Takahiro Miki; Toshio Kumamoto, both of Hyogo, Japan

[73] Assignee: Mitsubishi Denki Kabushiki Kaisha, Tokyo, Japan

[21] Appl. No.: 988,599

[22] Filed: Dec. 10, 1992

[30] Foreign Application Priority Data

Mar. 5, 1992 [JP] Japan .................. 4-048775

[51] Int. Cl.⁶ ............................. H03F 3/45
[52] U.S. Cl. ............................ 327/65; 330/295; 327/563
[58] Field of Search ............ 307/355, 362, 360, 494; 330/252, 254, 295, 296

[56] References Cited

U.S. PATENT DOCUMENTS

| | | |
|---|---|---|
| 4,109,214 | 8/1978 | Main . |
| 4,390,848 | 6/1983 | Blauschild ............... 330/254 |
| 4,752,766 | 6/1988 | Shimizu et al. .......... 341/159 |
| 4,774,498 | 9/1988 | Traa ...................... 341/159 |
| 4,939,518 | 7/1990 | Hotta et al. ............. 341/159 |
| 5,122,760 | 6/1992 | Nishijima ................ 330/254 |

FOREIGN PATENT DOCUMENTS

| | | |
|---|---|---|
| 0286347A2 | 10/1988 | European Pat. Off. . |
| 0397250A2 | 11/1990 | European Pat. Off. . |
| 3407200A1 | 9/1984 | Germany . |
| 63-31309 | 2/1988 | Japan . |
| 2-268521 | 11/1990 | Japan . |
| 62-188510 | 8/2987 | Japan . |

OTHER PUBLICATIONS

"A 10b 30MHZ Two-Step Parallel BiCMOS ADC with Internal S/H", by Akira Matsuzawa et al., 1990 IEEE International Solid-State Circuits Conference, pp. 162-163 and 290.

"Single-Transistor and Two-Transistor Amplifiers", pp. 194-203.

"A 10-b 15-MHz CMOS Recycling Two-Step A/D Converter", by Bang-Sup Song et al., IEEE Journal of Solid-State Circuits, vol. 25, No. 6, Dec. 1990, pp. 1328-1338.

Primary Examiner—Timothy P. Callahan.
Assistant Examiner—My. Trang Nu Ton
Attorney, Agent, or Firm—Lowe, Price, LeBlanc & Becker

[57] ABSTRACT

Disclosed is a high-speed A/D converter (15) including an improved differential amplifier circuit. Each comparator (61) provided in the A/D converter directly receives a complementary or differential analog input voltage to be converted. A differential amplifier circuit provided in each comparator compares an applied analog input voltage difference and an applied reference voltage difference. A binary signal indicative of a comparison result is applied to an encoder (4) through a binarization circuit. An analog input voltage which is not to be converted is directly applied to the comparator, that is, to the differential amplifier circuit through none of resistor elements and components, whereby conversion time delay is prevented.

29 Claims, 16 Drawing Sheets

TO BASES OF TRANSISTORS 301, 302

TO BASES OF TRANSISTORS 301, 302

DIFFERENTIAL AMPLIFIER, COMPARATOR AND HIGH-SPEED A/D CONVERTER USING THE SAME

BACKGROUND OF THE INVENTION

1. Field of the Invention

The present invention relates generally to a differential amplifier, a comparator and a high-speed A/D converter using the same, and more particularly, to an A/D converter having an improved operation speed. The present invention has particular applicability to series-parallel type A/D converters.

2. Description of the Background Art

Conventionally, converters for converting analog signals into digital signals (hereinafter referred to as an A/D converter) have been widely used for digital signal processing of analog signals. The field of video signal processing, for example, requires a high-speed digital signal processing, whereby an A/D converter should operate at a high speed.

Known A/D converters suitable for high-speed conversion are conventional parallel type A/D converter and series-parallel type A/D converter. In both of parallel type and series-parallel type A/D converters, a plurality of analog input signals are applied to inputs of comparators in parallel. In a series-parallel type A/D converter, an analog signal is converted into a digital signal on a time base in a serial manner.

A comparator for use in an A/D converter is generally provided with a differential amplifier. An operation speed of the differential amplifier therefore directly affects a conversion speed of the A/D converter. While the present invention is generally applicable to a differential amplifier and an electronic circuit using the same, an application of the present invention to an A/D converter will be described in the following by way of example.

FIG. 17 is a circuit block diagram of a conventional A/D converter. An equivalent circuit of the A/D converter shown in FIG. 17 is illustrated in "Digest of Technical Papers of ISSCC of 1990" pp. 162–163. With reference to FIG. 17, an A/D converter 900 includes a reference voltage generation circuit 902 for generating a reference voltage, a ladder resistor circuit 901, comparators 908a to 908f and an encoder 4. Complementary or differential analog input signals V1 and V2 are applied to the comparators 908a to 908f through the reference voltage generation circuit 902 and the ladder resistor circuit 901. The reference voltage generation circuit 902 is provided with voltage sources 903 to 906 each for generating a reference voltage $V_{REF}$. The ladder resistor circuit 901 has resistors each having a resistance value Rr connected in ladder. A potential difference between the opposite ends of each resistor is represented Vr. The encoder 4 outputs converted digital data D1 to Dm.

FIG. 18 is a diagram illustrating operation of the A/D converter shown in FIG. 17. With reference to FIGS. 17 and 18, the operation will be described in the following. Each of comparators 908a to 908f receives a positive input voltage and a negative input voltage from the ladder resistor circuit 901. For example, the comparator 908a receives a positive input voltage Vap and a negative input voltage Van from the ladder resistor circuit 901. Similarly, the comparator 908b receives a positive input voltage Vbp and a negative input voltage Vbn. FIG. 18 shows a change of an input voltage of each of the comparators 908a to 908f with respect to an analog input voltage V1. In other words, the abscissa shows a change of the analog input voltage V1, while the ordinate shows a change of the input voltage of each of the comparators 908a to 908f.

First, voltages Vcp and Vdp both equal to the input voltage V1, have rising solid lines in FIG. 18. The input voltage V2, complementary (or differential) to the input voltage V1 is shown by a falling solid line having an absolute value equal to that of V1. The voltages Vcn and Vdn are therefore shown by a falling solid line at the center of the diagram.

The voltage Vap becomes higher than the input voltage V1 by $V_{REF}$ because of the voltage source 903. On the other hand, the voltage Van becomes lower than the input voltage V2 by $V_{REF}$ because of the voltage source 905. The voltages Vap and Van are therefore shown by a rising solid line and a falling solid line in the diagram, respectively. The voltage Vfp becomes lower than the input voltage V1 by $V_{REF}$ because of the voltage source 904. The voltage Vfn becomes higher than the input voltage V2 by $V_{REF}$ because of the voltage source 906. The voltages Vfp and Vfn are therefore shown by a rising solid line and a falling solid line, respectively, in the diagram.

Each of the comparators 908a to 908f compares a received positive input voltage with a received negative input voltage. For example, the comparator 908a compares a voltage Vap with Van. When V1−V2 is equal to −2 $V_{REF}$ the voltage Yap becomes equal to the voltage Van. The comparator 908a therefore outputs a low level (logical low) signal when V1−V2 is smaller than −2 $V_{REF}$, while it outputs a high level (logical high) signal when V1−V2 is larger than −2 $V_{REF}$.

The comparator 908b compares voltages Vbp and Vbn. When V1−V2 is equal to −2 $V_{REF}$+2 Vr, the voltage Vbp becomes equal to Vbn. Therefore, the comparator 908b outputs a low level signal when V1−V2 is smaller than −2 $V_{REF}$+2 Vr, while it outputs a high level signal when V1−V2 is larger than −2 $V_{REF}$+2 Vr.

In the same manner, each time a difference V1−V2 between the input voltages V1 and V2 is increased by 2 Vr, the number of the comparators to output a high level signal is increased one by one starting from 908a toward 908f shown in FIG. 17. Change of the output signals of the comparators 908a to 908f is shown in the following table 1.

TABLE 1

| Analog Input V1-V2 | Comparator Output | | | | | | |
|---|---|---|---|---|---|---|---|
| | 908a | 908b | ... | 908c | 908d | ... | 908e | 908f |
| ~ −2$V_{REF}$ | L | L | | L | L | | L | L |
| −2$V_{REF}$ | H | L | | L | L | | L | L |
| ~ −2$V_{REF}$ + 2Vr | | | | | | | | |
| −2$V_{REF}$ + 2Vr | H | H | | L | L | | L | L |
| ~ −2$V_{REF}$ + 4Vr | | | | | | | | |
| ... | | | | | | | | |
| −2Vr ~0 | H | H | | L | L | | L | L |
| 0 ~2Vr | H | H | | H | H | | L | L |
| ... | | | | | | | | |
| 2$V_{REF}$ − 4Vr ~2$V_{REF}$ − 2Vr | H | H | | H | H | | L | L |
| 2$V_{REF}$ − 2Vr ~2$V_{REF}$ | H | H | | H | H | | H | L |

TABLE 1-continued

| Analog Input | Comparator Output | | | | | | |
|---|---|---|---|---|---|---|---|
| V1−V2 | 908a | 908b | ... | 908c | 908d | ... | 908e | 908f |
| $2V_{REF}\sim$ | H | H | | H | H | | H | H |

As is seen from Table 1, every time the difference V1−V2 of input voltages is increased by 2 Vr, an increased number of comparators output a high level signal, starting from the left hand side toward the right hand side of table 1. In other words, the comparators 908a to 908f output signals called "thermometer code". The encoder 4 receives thermometer codes from the comparators 908a to 908f to output digital signals D1 to Dm.

As is seen from FIG. 17, each of the comparators 908a to 908f receives corresponding positive input voltage and negative input voltage through the ladder resistor circuit 901. In other words, complementary or differential analog input signals V1 and V2 to be converted are applied to each of the comparators 908a to 908f through the ladder resistor circuit 901. The corresponding positive input terminal and negative input terminal of each of the comparators 908a to 908f have parasitic capacitance with respect to ground. A change of the applied positive input voltage and negative input voltage is delayed according to a time constant determined by the parasitic capacitance and the resistance Rr of the ladder resistor circuit 901. In other words, a change of the input voltage applied to each comparator is delayed to reduce a conversion speed of the A/D converter 900.

SUMMARY OF THE INVENTION

An object of the present invention is to improve a conversion speed of an A/D converter.

Another object of the present invention is to provide a differential amplifier suitable for high-speed A/D conversion.

A further object of the present invention is to provide a comparator suitable for high-speed A/D conversion.

According to one aspect, a differential amplifier according to the present invention includes a first constant current source for flowing a first predetermined constant current, a second constant current source for flowing a second predetermined constant current, an increasing current supply circuit for supplying an increasing current to the first constant current source in response to an analog input signal, a decreasing current supply circuit for supplying a decreasing current to the first constant current source in response to another analog input signal, a first constant current supply circuit for supplying a third predetermined constant current to the second constant current source in response to a first applied reference voltage, a second constant current supply circuit for supplying a fourth predetermined constant current to the second constant current source in response to a second applied reference voltage, a first load circuit having one end connected to a power source potential and the other end connected to the increasing current supply circuit and the second constant current supply circuit, and a second load circuit having one end connected to the power source potential and the other end connected to the decreasing current supply circuit and the first constant current supply circuit. The first predetermined constant current is equivalent to a sum of the increasing current and the decreasing current. The second predetermined constant current is equivalent to a sum of the third and the fourth constant currents. The differential output voltage is provided through the other end of each of the first and the second load circuits.

In accordance with the another aspect of the present invention, the differential amplifier includes a first constant current source for flowing a first predetermine constant current, a second constant current source for flowing a second predetermined constant current, an increasing current supply circuit for supplying an increasing current to the first constant current source in response to an analog input signal, a first compensation current supply circuit for supplying a first compensation current to the first constant current source, a decreasing current supply circuit for supplying a decreasing current to the second constant current source in response to another analog input signal, a second compensation current supply circuit for supplying a second compensation current to the second constant current source, a first load circuit having one end connected to a power source potential and the other end connected to the increasing current supply circuit and the second compensation current supply circuit, and a second load circuit having one end connected to the power source potential and the other end connected to the decreasing current supply circuit and the first compensation current supply circuit. A differential output voltage is provided through the other end of each of the first and the second load circuits.

According to a further aspect of the present invention, a comparator includes one of the above-described differential amplifiers, and a binarization circuit for generating a binary signal in response to a differential output voltage provided from the differential amplifier.

According to still further aspect of the present invention, an A/D converter includes a differential signal generation circuit for generating first and second differential signals in response to an analog input signal and another analog input signal, a reference voltage generation circuit for generating first and second reference voltages for defining a predetermined large potential difference and third and fourth reference voltages for defining a predetermined small potential difference, a first comparator for comparing a voltage difference between the first and the second differential signals and a difference between the first and the second reference voltages, and a second comparator for comparing a voltage difference between the first and the second differential signals and a difference between the third and the fourth reference voltages. Each of the first and second comparators is realized by the above-described comparator.

In operation of the A/D converter, an analog input signal to be converted is directly applied to the comparator, that is, to the differential amplifier without passing through the resistance circuit, which allows the differential amplifier and the comparator to operate at a high speed. Therefore, the conversion speed of the A/D converter can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
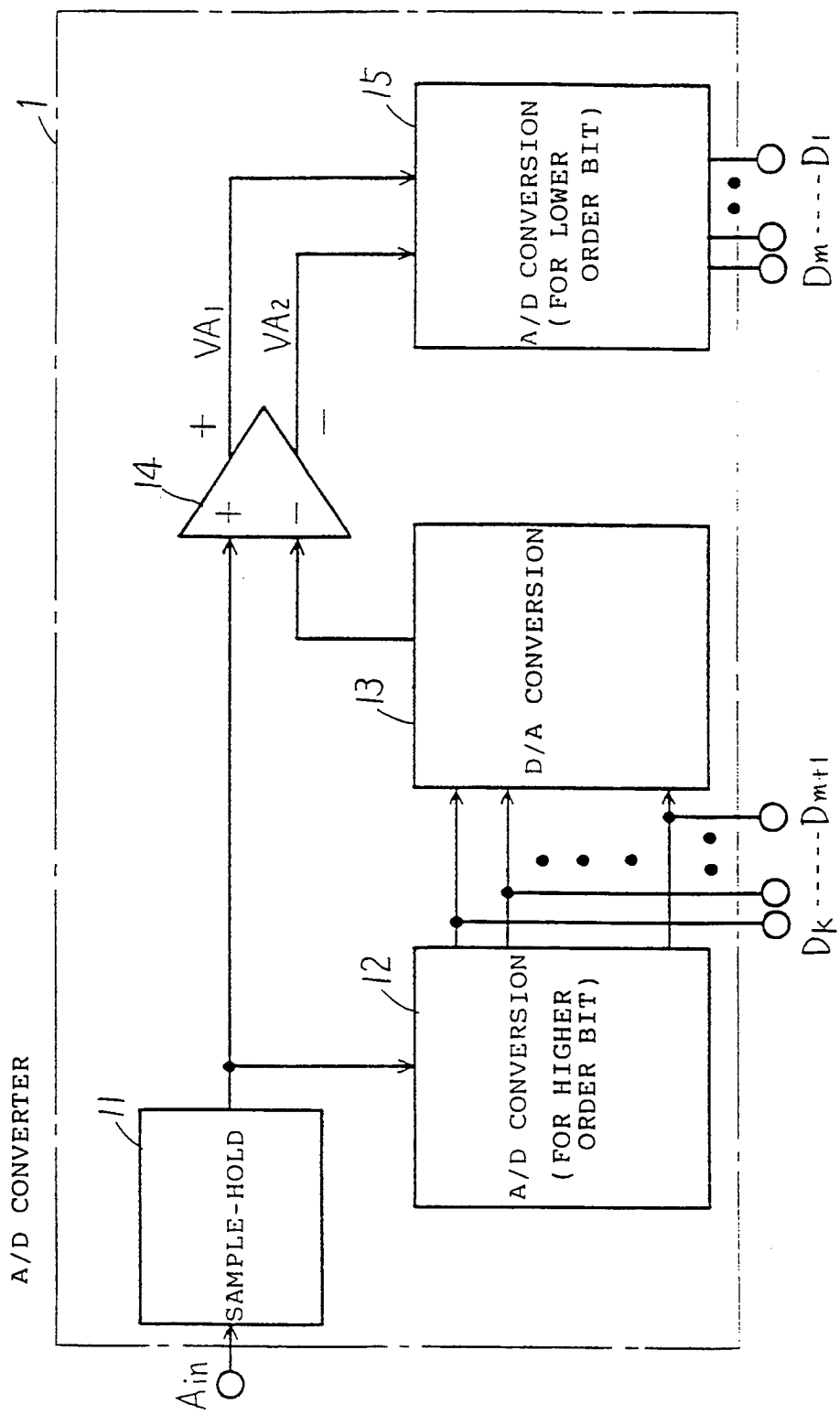
FIG. 1 is a circuit block diagram of a series-parallel type A/D converter according to one embodiment of the present invention.

With reference to FIG. 1, an A/D converter 1 includes a sample-hold circuit 11 for receiving an externally applied analog input signal Ain, a higher-order bit A/D converting circuit 12, a D/A converting circuit 13 for returning higher-order bits of converted data to an analog signal, a differential amplifier 14 for outputting complementary or differential analog voltages VA1 and VA2, and a lower-order bit A/D converting circuit 15. The A/D converting circuit 15 outputs lower-order bits of converted data D1 to Dm. The A/D converting circuit 12 outputs higher-order bits of converted data Dm+1 to Dk. As a result, digital data D1 to Dk of the total of k bits are obtained.

In operation, a signal sampled in the sample-hold circuit 11 is applied to the A/D converting circuit 12 and the differential amplifier 14. The A/D converting circuit 12 obtains the higher-order bits of converted data Dm+1 to Dk. The higher-order bits of converted data Dm+1 to Dk are applied to the D/A converting circuit 13 wherein the data are restored to analog signals. The differential amplifier 14 receives the signal sampled by the sample-hold circuit 11 and the higher-order bits restored analog signals to output complementary or differential voltages VA1 and VA2. The voltages VA1 and VA2 are applied to the A/D converting circuit 15 as complementary or differential input signals. The A/D converting circuit 15 converts the applied voltages VA1 and VA2 into lower-order bits of converted data D1 to Dm and outputs the same.

Figure 2:
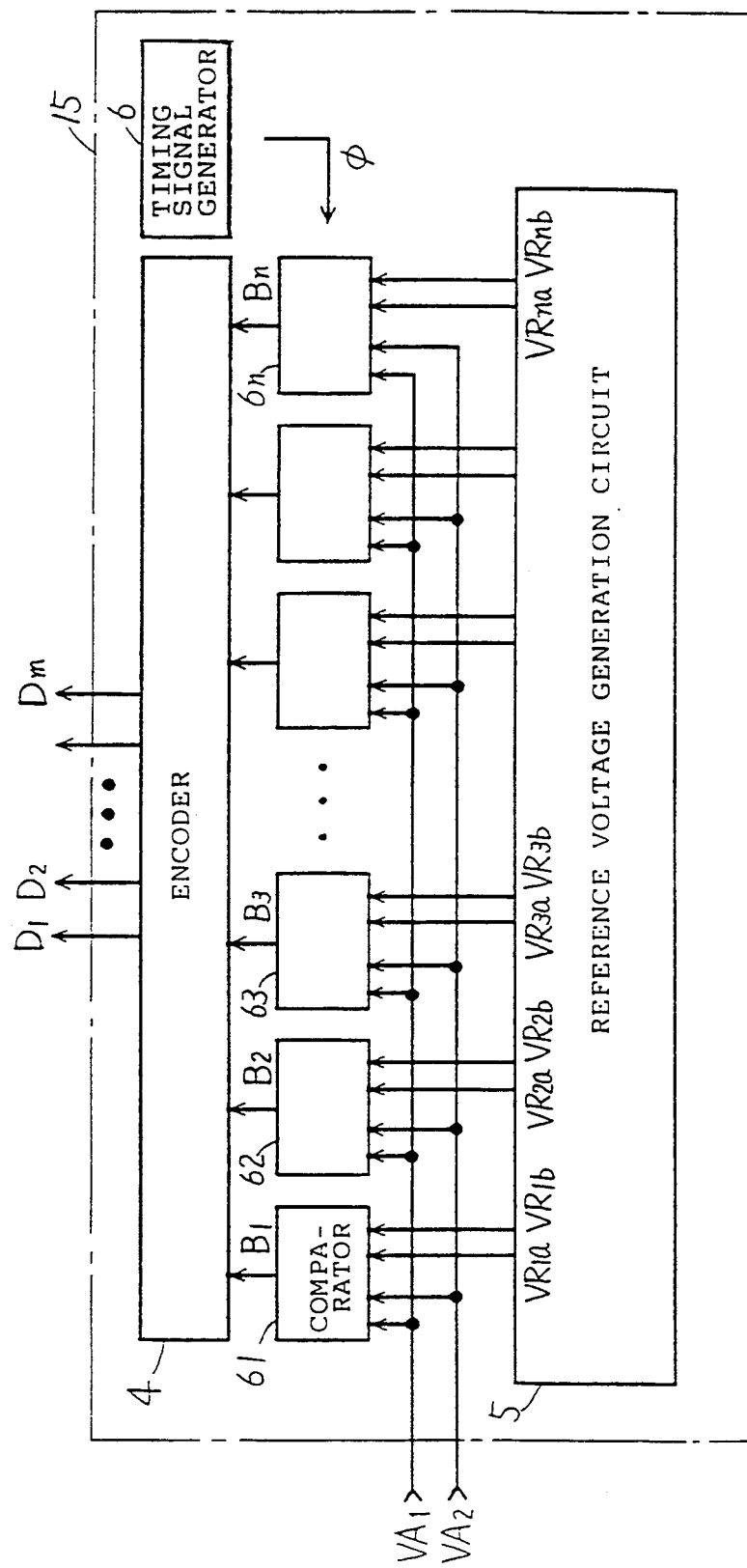
FIG. 2 is a circuit block diagram of a lower-order bit A/D converting circuit shown in FIG. 1.

FIG. 2 is a circuit block diagram of the lower-order bit A/D converting circuit shown in FIG. 1. With reference to FIG. 2, the A/D converting circuit 15 includes a reference voltage generation circuit 5 for generating n reference voltage pairs of VR1a and VR1b to VRna and VRnb, comparators 61–6n each receiving differential input voltages VA1 and VA2 and a corresponding reference voltage pair, an encoder 4 for encoding a thermometer code output from the comparators 61 to 6n, and a timing signal generator 6.

Figure 3:
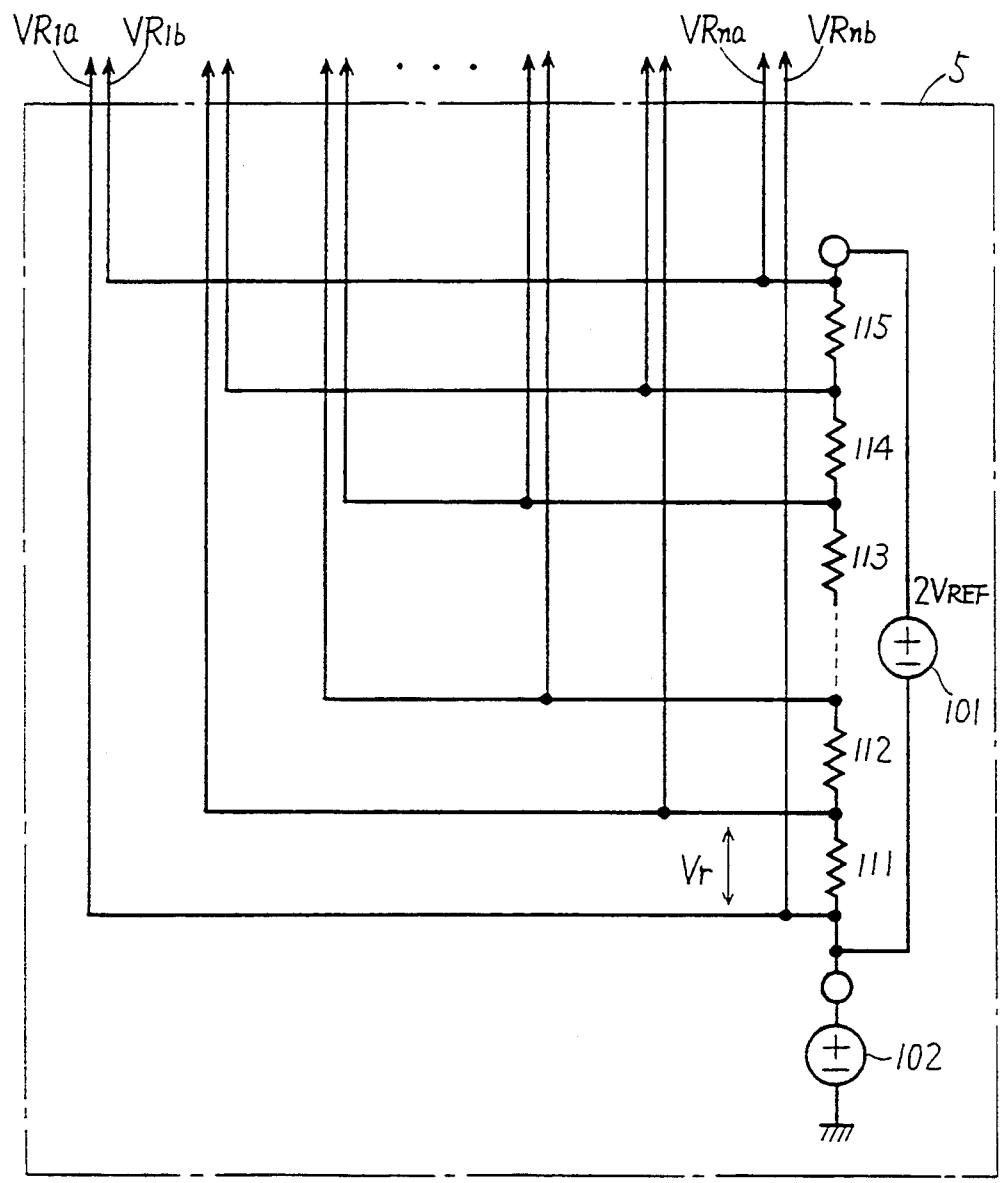
FIG. 3 is a schematic circuit diagram of a reference voltage generation circuit shown in FIG. 2.

FIG. 3 is a schematic circuit diagram of the reference voltage generation circuit 5 shown in FIG. 2. With reference to FIG. 3, the reference voltage generation circuit 5 includes a serial connection of resistors 111 to 115, a constant voltage source 102 for biasing the serial connection, and a constant voltage source 101 for applying a constant voltage 2 $V_{REF}$ to the serial connection. A potential difference between the opposite ends of each of the resistors 111 to 115 is expressed by Vr. With the reference voltage generation circuit 5 structured as shown in FIG. 3, voltages listed in the following Table 2 are output as the reference voltage pairs of VR1a and VR1b to VRna and VRnb.

TABLE 2

| | |
|---|---|
| VR1a − VR1b | $-2V_{REF}$ |
| VR2a − VR2b | $-2V_{REF} + 2V_r$ |
| VR3a − VR3b | $-2V_{REF} + 4V_r$ |
| . . | . |
| . | . |
| . | . |
| V(n − 2)a − V(n − 2)b | $-2V_{REF} - 4V_r$ |
| V(n − 1)a − V(n − 1)b | $-2V_{REF} - 2V_r$ |
| Vna − Vnb | $-2V_{REF}$ |

Again with reference to FIG. 2, operation of the A/D converting circuit 15 will be described. The complementary or differential input voltages VA1 and VA2 output from the differential amplifier 14 shown in FIG. 1 are applied to each of the comparators 61 to 6n. In addition thereto, each of the comparators 61 to 6n receives a corresponding one of the reference voltage pairs of VR1a and VR1b to VRna and VRnb generated from the reference voltage generation circuit 5. Each of the comparators 61 to 6n performs a similar comparison processing as will be described later in detail and thermometer code (defined by binary signals B1 to Bn) indicative of a comparison result is applied to the encoder 4. The encoder 4 encodes the applied thermometer code and outputs lower-order bits of converted data D1 to Dm.

Each comparator, the comparator 61, for example, compares the difference between the analog input voltages VA1 and VA2 with a difference between the applied reference voltages VR1a and VR1b. When VA1−VA2<VR1a−VR1b is established, the comparator 61 outputs a low level signal V1. When VA1−VA2>VR1a−VR1b is established, the comparator 61 outputs a high level signal B1. In other words, each of the comparators 61 to 6n outputs binary signals B1 to Bn indicative of a comparison result in response to a difference voltage between the analog input signals VA1 and VA2 and a difference voltage between corresponding applied paired reference voltages.

The comparator 61 therefore outputs a low level signal when the difference voltage VA1−VA2 between the analog input signals VA1 and VA2 is smaller than a difference voltage −2 $V_{REF}$ of the corresponding reference voltage pair shown in FIG. 2, while the comparator 61 outputs a high level signal when the difference voltage is larger than the same. In the same manner, the comparator 62 outputs a low level signal B2 when the input difference voltage VA1−VA2 is smaller than (−2 $V_{REF}$+2 Vr), while the comparator 62 outputs a high level signal B2 when the difference voltage is larger than the same. The other comparators 63 to 6n operate in the same manner. As a result, the following output table for the comparators 61 to 6n is obtained according to a difference VA1−VA2 of analog input voltages. In Table 3, "H" represents a high level output signal, while "L" represents a low level output signal.

TABLE 3

| Analog Input | Comparator Output | | | | | | |
|---|---|---|---|---|---|---|---|
| VA1-VA2 | 61 | 62 | 63 | ... | $6_{n-2}$ | $6_{n-1}$ | 6n |
| ~ −2$V_{REF}$ | L | L | L | | L | L | L |
| −2$V_{REF}$ | H | L | L | | L | L | L |
| ~ −2$V_{REF}$ + 2Vr | | | | | | | |
| − 2$V_{REF}$ + 2Vr | H | H | L | | L | L | L |
| ~ −2$V_{REF}$ + 4Vr | | | | | | | |
| −2$V_{REF}$ + 4Vr | H | H | H | | L | L | L |
| ~ −2$V_{REF}$ + 6Vr | | | | | | | |
| . | | | | | | | |
| . | | | | | | | |
| 2$V_{REF}$ − 6Vr | H | H . | H | | L | L | L |
| ~ −2$_{REF}$ − 4Vr | | | | | | | |
| 2$V_{REF}$ − 4Vr | H | H | H | | H | L | L |
| −2$_{REF}$ − 2Vr | | | | | | | |
| 2$V_{REF}$ − 2Vr | H | H | H | | H | H | L |
| −2$V_{REF}$ | | | | | | | |
| 2$V_{REF}$ ~ | H | H | H | | H | H | H |

As can been seen from Table 3, a change of the difference voltage VA1−VA2 of analog input voltages is followed by a change of a thermometer code output from each of the comparators 61 to 6n. That is, the number of comparators which output high level ("H") is increased one by one in due order every time the difference voltage VA1−VA2 of the analog input voltages is increased by 2 Vr. The encoder 4 shown in FIG. 2 receives thermometer codes listed in Table 3 to perform encoding processing. In other words, the encoder detects a boundary position between comparators outputting low level signals and comparators outputting high level signals and outputs digital converted data D1 to Dm according to the position of the boundary.

Figure 4:
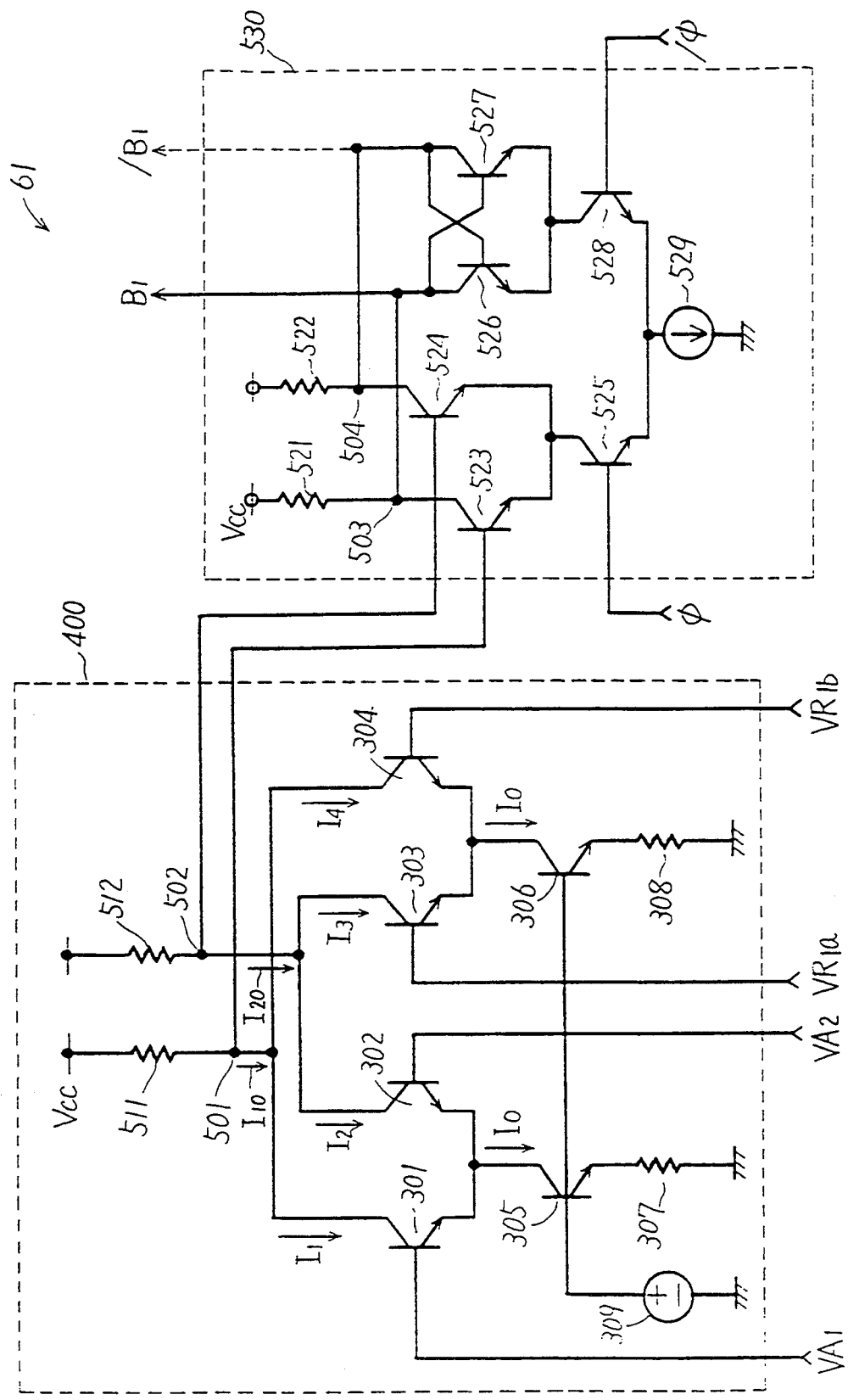
FIG. 4 is a circuit diagram of a comparator shown in FIG. 2.

FIG. 4 is a circuit diagram of one comparator shown in FIG. 2. The comparator 61 is shown as an example. With reference to FIG. 4, the comparator 61 includes a differential amplifier circuit 400 and a binarization circuit 530. The differential amplifier circuit 400 includes npn transistors 301 to 306, resistors 307, 308, 511 and 512 and a constant voltage source 309. The output voltage of the constant voltage source 309 is applied to the bases of the transistors 305 and 306. As a result, each of the transistors 305 and 306 flows a constant current I0. In other words, the transistor 305, the resistor 307 and the constant voltage source 309 constitute a constant current source, while the transistor 306, the resistor 308 and the constant voltage source 309 constitute another constant current source.

The emitters of the transistors 301 and 302 are connected together to the collector of the transistor 305. The emitters of the transistors 303 and 304 are connected together to the collector of the transistor 306. The collectors of the transistors 301 and 304 are connected to the resistor 511 through a node 501. The collectors of the transistors 302 and 303 are connected to the resistor 512 through a node 502. A differential voltage is applied to the binarization circuit 530 through the nodes 501 and 502.

The binarization circuit 530 is structured by npn transistors 523 to 528, a constant current source 529 and resistors 521 and 522. The base of the transistor 523 is connected to the node 501 of the differential amplifier circuit 400. The base of the transistor 524 is connected to the node 502. The bases of the transistors 525 and 528 respectively receive switching signals $\phi$ and $\bar{\phi}$ generated from the timing signal generator 6 shown in FIG. 2. The emitters of the transistors 523 and 524 are connected together to the collector of the transistor 525. The emitters of the transistors 526 and 527 are connected together to the collector of the transistor 528. The emitters of the transistors 525 and 528 are connected together to the constant current source 529. The base of the transistor 526 is connected to the collector of the transistor 527 and the base of the transistor 527 is connected to the collector of the transistor 526.

Following is the description of operation of the circuit shown in FIG. 4. For the purpose of simplicity, a current amplification factor $\alpha_F$ of each transistor is assumed to be 1.0 (in actuality, about 0.99) in the following description. A sum of a collector current I1 of the transistor 301 and a collector current I2 of the transistor 302 is equal to the collector current I0 of the transistor 305 constituting the constant current source. Therefore, when the base potentials of the transistors 301 and 302, that is, the input voltages VA1 and VA2 are equal to each other, the current I0 is equally shunt to the transistors 301 and 302 because of the symmetry of the circuit structure. On the other hand, when the base potential of the transistor 301 is higher than that of the transistor 302, the base-emitter voltage $V_{BE}$ of the transistor 301 becomes higher than that of the transistor 302. As a result, the collector current of the transistor 301 becomes larger than that of the transistor 302. In other words, an increased amount of the current I0 flows through the transistor 301, while a reduced amount of the current flows through the transistor 302.

Where the input voltage VA1 is slightly higher than the input voltage VA2, the current I1 flowing through the transistor 301 is increased proportionally to the input voltage difference VA1−VA2. On the other hand, where the input voltage difference VA1−VA2 is sufficiently large, most of the current I0 flows through the transistor 301.

Figure 5:
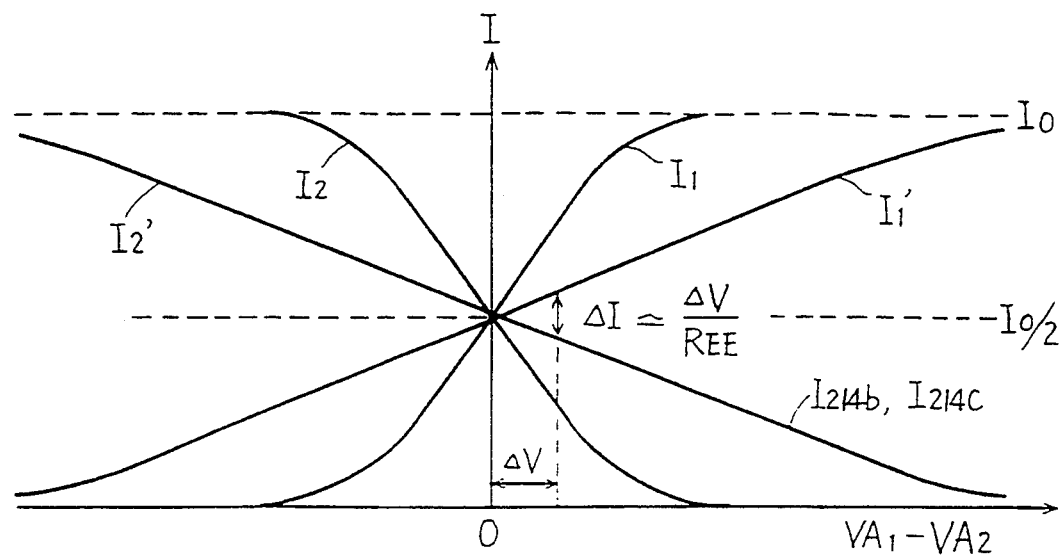
FIG. 5 is a graph showing a relationship between an input voltage difference and a shunt current.

FIG. 5 is a graph showing a relationship between the input voltage difference VA1−VA2 and shunt currents I1 and I2. With reference to FIG. 5, the abscissa represents the input voltage difference VA1−VA2, while the ordinate represents the amount of the current I. The curve I1 shows a change of a current flowing through the transistor 301 and the curve I2 shows a change of the current flowing through the transistor 302. As described above, where |VA1−VA2| is small, the currents I1 and I2 are changed proportionally to the voltage difference VA1−VA2. On the other hand, where |VA1−VA2| is large, both of the currents I1 and I2 approximate to the current value I0. It is pointed out that the sum of the currents I1 and I2 is constantly equal to the current I0.

In general, a collector current of a transistor is relatively largely changed in response to a change of the base-emitter voltage $V_{BE}$. Therefore, where $|VA1-VA2|$ is small, the curves I1 and I2 have a shape inclination and otherwise the inclination is gradually reduced. It is therefore understood from the characteristics shown in FIG. 5 that the differential amplifier circuit 400 shown in FIG. 4 is sensitive to a small input voltage difference but cannot be used to detect a large input voltage difference.

As described above, as the input voltage difference VA1−VA2 is increased, the current I1 is increased, while the current I2 is reduced. Such characteristic will be referred to as "monotonousness" in the following description. In addition, the sum of the currents I1 and I2 is equal to the current I0. Such characteristic will be referred to as "complementarity". It is also pointed out that the circuit 400 shown in FIG. 4 is symmetric in term of a circuit characteristic in its circuit structure.

In the following description, it is further assumed that a current I3 flows through the transistor 303 and a current I4 flows through the transistor 304. The transistor 306 also functions as a constant current flowing the current I0 having the same value as that of the transistor 305. A relationship I3+I4=I0 is established as a result.

Concerning I1 and I3, functions f1 and f2 having the following relationship are defined.

$$I1 = I0/2 + f1 \; (VA1-VA2) \tag{1}$$

$$I3 = I0/2 + f2 \; (VR1a-VR1b) \tag{2}$$

The function f1 provides a change of the current I1 from the intermediate current value I0/2 according to the input voltage difference VA1−VA2. Similarly, the function f2 provides a change of the current I3 from the intermediate value I0/2 according to the input voltage difference VR1a−VR1b.

With VA1−VA2=x1 and VR1a−VR1b=x2, the following relationships are established concerning the functions f1 and f2.

$$\text{if } x1 < x2, f1 \; (x1) < f1 \; (x2) \tag{3a}$$

$$\text{if } x1 > x2, f1 \; (x1) > f1 \; (x2) \tag{3b}$$

$$\text{if } x2 < x1, f2 \; (x1) < f2 \; (x2) \tag{4a}$$

$$\text{if } x2 > x1, f2 \; (x1) > f2 \; (x2) \tag{4b}$$

In addition, the following relationships are derived from the above-described "complementarity".

$$I2 = I0 - I1 = I0/2 - f1 \; (VA1-VA2) \tag{5}$$

$$I4 = I0 - I3 = I0/2 - f2 \; (VR1a-VR1b) \tag{6}$$

Further derived from the above "complementarity" and equations (5) and (6) are the following relationships.

$$-f1 \; (VA2-VA1) = f1 \; (VA1-VA2) \tag{7}$$

$$-f2 \; (VR1b-VR1a) = f2 \; (VR1a-VR1b) \tag{8}$$

The following equations are obtained by substituting VA1−VA2=0 and VR1a−VR1b=0 for equations (7) and (8).

$$f1 \; (0) = 0 \tag{9}$$

$$f2 \; (0) = 0 \tag{10}$$

As described in the foregoing, because of "complementarity" of the differential amplifier circuit 400, the following relationship is established based on equations (1), (2), (5) and (6).

$$\begin{aligned}I20-I20&=(I1+I4)-(I2+I3)=2 \cdot f1 \\ &(VA1-VA2)-2 \cdot f2 \; (VR1a-VR1b)\end{aligned} \tag{11}$$

In particular, when a circuit structured by the transistors 301 and 302 and a circuit structured by the transistors 303 and 304 have the same circuit characteristics, f1=f2 is established. Thus, $$I10-I20 = 2 \cdot f1 \; (VA1-VA2) - 2 \cdot f1 \; (VR1a-VR1b) \tag{12}$$

When I10>I20, f1(VA1−VA2)>f1(VR1a−VR1b) is established. Further established is (VA1−VA2)>(VR1a−VR1b) based on the equation (3) showing "monotonousness". As a result, the following relationships are established because of "monotonousness", "complementarity" and symmetricalness of circuit characteristics of the differential amplifier circuit 400 as shown in FIG. 4.

$$\text{if } I10 < I20, (VA1-VA2) < (VR1a-VR1b) \tag{13a}$$

$$\text{if } I10 > I20, (VA1-VA2) > (VR1a-VR1b) \tag{13b}$$

Modification of inequalities (13a) and (13b) results in the following relationships.

$$\text{if } I10 < I20, (VA1-VR1a) < (VA2a-VA1b) \tag{14a}$$

$$\text{if } I10 > I20, (VA1-VR1a) > (VA2a-VR1b) \tag{14b}$$

It can be seen from the inequalities (13a) and (13b) that the relationship between the currents I10 and I20 is changed according to a difference between the input voltage difference VA1−VA2 and another input voltage difference VR1a−VR1b. It is also seen from the inequalities (14a) and (14b) that the relationship between the currents I10 and I20 is also changed according to a difference between the input voltage difference VA1−VR1a and the input voltage difference VA2−VR1b.

The following is the description of operation of the binarization circuit 530 shown in FIG. 4. The resistors 521 and 522, the transistors 523 to 525 and the constant current source 529 form a differential amplifier. The transistors 526 and 527 form a bistable circuit (or a latch circuit). The differential amplifier and the bistable circuit are alternately activated in response to the activation signals $\phi$ and $\overline{\phi}$. The bases of the transistors 523 and 524 receive the voltages of the nodes 501 and 502, respectively, in the differential amplifier circuit 400. The voltages at the nodes 501 and 502 are changed according to a difference between the input voltage differences VA1−VA2 and VR1a−VR1b. When a high level activation signal is applied to the base of the transistor 525, the differential amplifier is activated. Then, the transistors 523 and 524 convey the flow of a collector current in response to the voltages at the nodes 501 and 502. With the resistors 521 and 522 having the same resistance value, a voltage based on a comparison result is applied through nodes 503 and 504 to the bistable circuit (or the latch circuit) formed by the transistors 526 and 527. The bistable circuit is activated when a high level activation signal $\bar{\phi}$ is applied. Then, the bistable circuit latches an applied voltage indicative of the comparison result and outputs a binary signal B1 (and/or $\overline{B1}$).

As described above, the differential amplifier circuit 400 shown in FIG. 4 is highly sensitive where the input voltage difference |VA1−VA2| is relatively small, it becomes less sensitive as the input voltage difference becomes larger. In order to achieve high sensitivity in a wider range of the input voltage difference |VA1−VA2|, proposed are differential amplifier circuits 400a and 400b shown in FIGS. 7 and 8 as will be described in the following.

Figure 7:
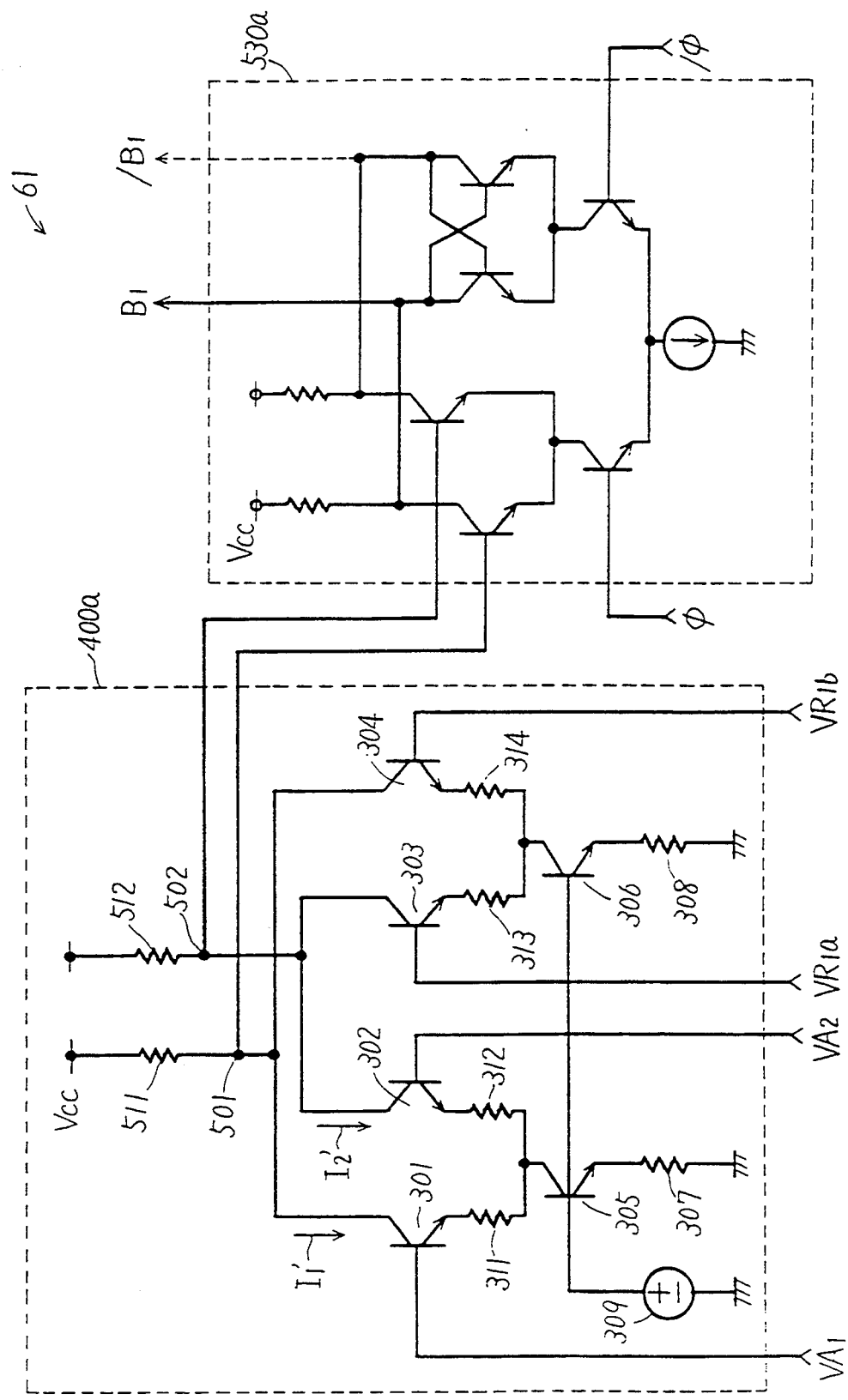
FIG. 7 is a circuit diagram of a comparator according to another embodiment of the present invention.

FIG. 7 is a circuit diagram of a comparator showing another embodiment of the present invention. With reference to FIG. 7, a differential amplifier circuit 400a further includes resistors 311 to 314 as compared with the circuit 400 shown in FIG. 4. More specifically, the resistors 311 and 312 are connected between the respective emitters of the transistors 301 and 302 and the collector of the transistor 305. The resistors 313 and 314 are connected between the respective emitters of the transistor 303 and 304 and the collector of the transistor 306. The remaining part of the circuit structure is the same as that of the circuit 400 shown in FIG. 4, of which no description is made herein.

The basic operation of the differential amplifier circuit 400a shown in FIG. 7 is the same as that of the circuit 400 shown in FIG. 4. However, the following improvement is made. As is already described, a collector current of a transistor, in general, is relatively greatly changed according to a change of a base-emitter voltage $V_{BE}$. In other words, when the change of the collector current is not so large, the base-emitter voltage $V_{BE}$ is not so largely changed. Therefore, when the input voltage difference |VA1−VA2| is small and a change of the collector currents of the transistors 301 and 302 is not so large, the base-emitter voltage $V_{BE}$ of the transistor 301 is substantially equal to that of the transistor 302. As a result, a difference between the voltage applied across the resistor 311 and the voltage applied across the resistor 312 is equal to the input voltage difference VA1−VA2. A difference between the current flowing through the resistor 311 and that flowing through the resistor 312 is proportional to the input voltage difference VA1−VA2. A difference between the currents I1 and I2 is accordingly changed proportionally to the input voltage difference VA1−VA2.

With a sum of the currents I1 and I2 equal to the current I0, the currents I1 and I2 approximate to the current value I0 in a range where the input voltage difference |VA1−VA2| is large. FIG. 5 shows a change of the currents I1' and I2' with respect to the input voltage difference VA1−VA2. In FIG. 5, the curve I1' represents a change of a current flowing through the transistor 301 shown in FIG. 7, while the curve I2' represents a change of a current flowing through the transistor 302. Assuming that each of the resistors 311 and 312 has the current value $R_{EE}$, the relationship of I1'−I2'=ΔV/$R_{EE}$ is established when the input voltage difference VA1−VA2 is ΔV. Therefore, with an increase in the resistance value $R_{EE}$, the inclinations of the curves I1' and I2' shown in FIG. 5 are reduced. As a result, the sensitivity is slightly lowered, while expanding a range of an allowable input voltage difference VA1−VA2.

Figure 8:
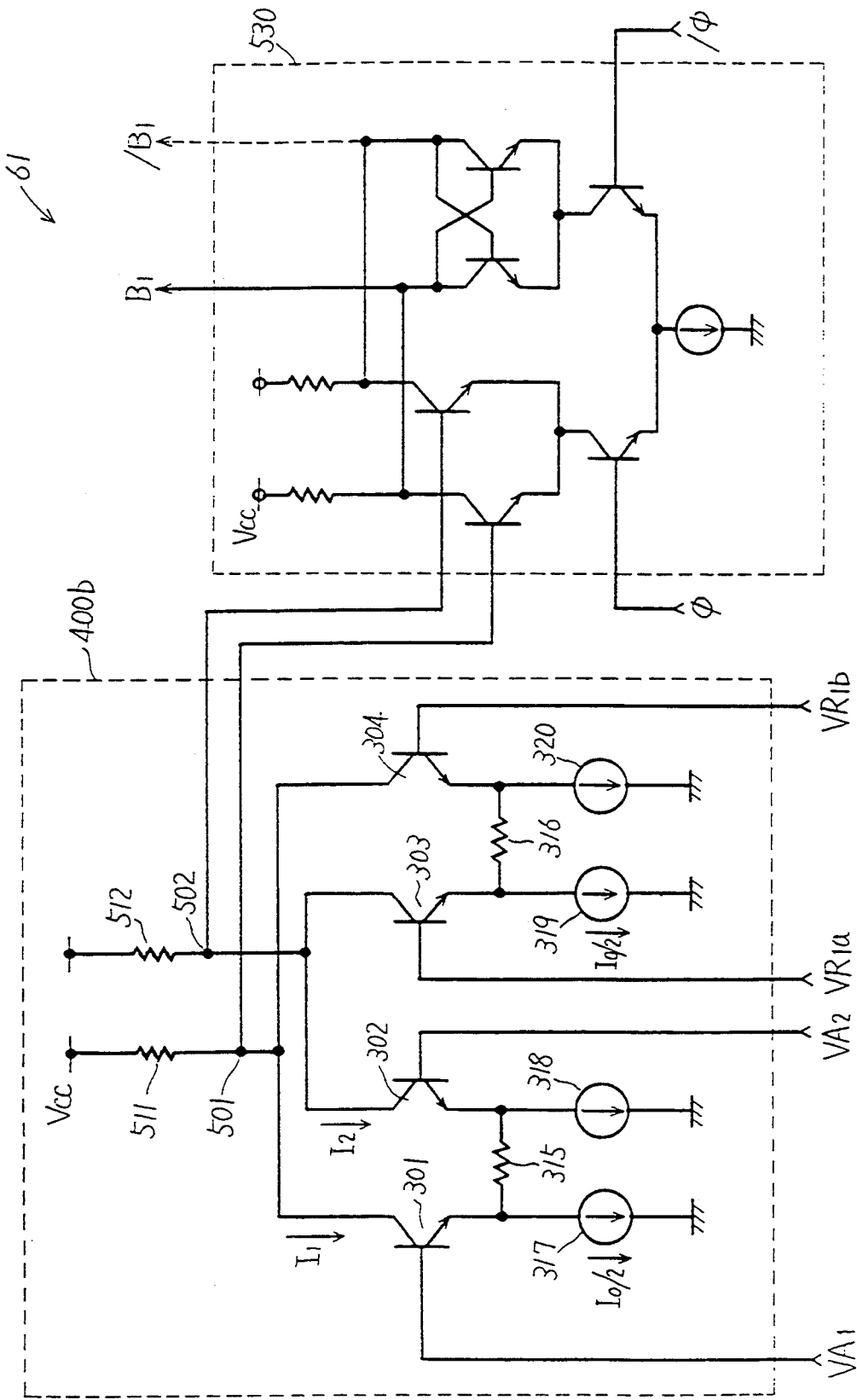
FIG. 8 is a circuit diagram of a comparator according to a further embodiment of the present invention.

FIG. 8 is a circuit diagram of a comparator of a further embodiment of the present invention. A use of a differential amplifier circuit 400c shown in FIG. 8 also enlarges an allowable range of the input voltage difference VA1−VA2. Constant current sources 317 to 320 each having an output current of I0/2 are respectively connected between the emitters of the npn transistors 301 to 304 and ground. A resistor 315 is connected between the emitters of the transistors 301 and 302. A resistor 316 is connected between the emitters of the transistors 303 and 304. The remaining part of the circuit structure is the same as that of the circuit 400 shown in FIG. 4, of which no description is made herein.

A sum of the current I1 flowing through the transistor 301 and the current I2 flowing through the transistor 302 is equal to I0. With the input voltage difference VA1−VA2 being 0, the potentials at the emitters of the transistors 301 and 302 are equal to each other, so that no current flows through the resistor 315. Therefore, the currents I1 and I2 flow with the relationship of I1=I2=I0/2 established.

As described in the foregoing, when a collector current change is not so large, a base-emitter voltage $V_{BE}$ is not changed so greatly. The base-emitter voltages $V_{BE}$ of the transistors 301 and 302 are substantially equal to each other in a range where the input voltage difference |VA1−VA2| is small. A voltage applied across the resistor 315 is therefore equal to the input voltage difference VA1−VA2.

Assuming that the resistance value of the resistor 315 is denoted by 2·$R_{EE}$ and the input voltage difference VA1−VA2 by ΔV, the current flowing through the resistor 315 is expressed as ΔV/2·$R_{EE}$. As a result, the current I1 is expressed as $I_{EE}$/2+ΔV/2·$R_{EE}$. On the other hand, the current I2 is expressed as $I_{EE}$/2−ΔV/2·$R_{EE}$. The difference I1−I2 therefore attains ΔV/$R_{EE}$.

It can be seen that the current difference I1−I2 is changed proportionally to the input voltage difference VA1−VA2. However, since the sum of the currents I1 and I2 is equal to I0, the current I1 approximates to the current value I0 in a range where most of the current I0 flows as the current I0, for example, in a range where the input voltage difference VA1−VA2 is large. Therefore, the relationship shown by the curves I1' and I2' in FIG. 5 is obtained also in this embodiment. Also in the differential amplifier circuit 400b shown in FIG. 8, the inclinations of the curves I1' and I2' are reduced as the resistance value $R_{EE}$ is increased, thereby lowering sensitivity. On the other hand, an allowable input voltage difference |VA1−VA2| is increased.

Figure 9:
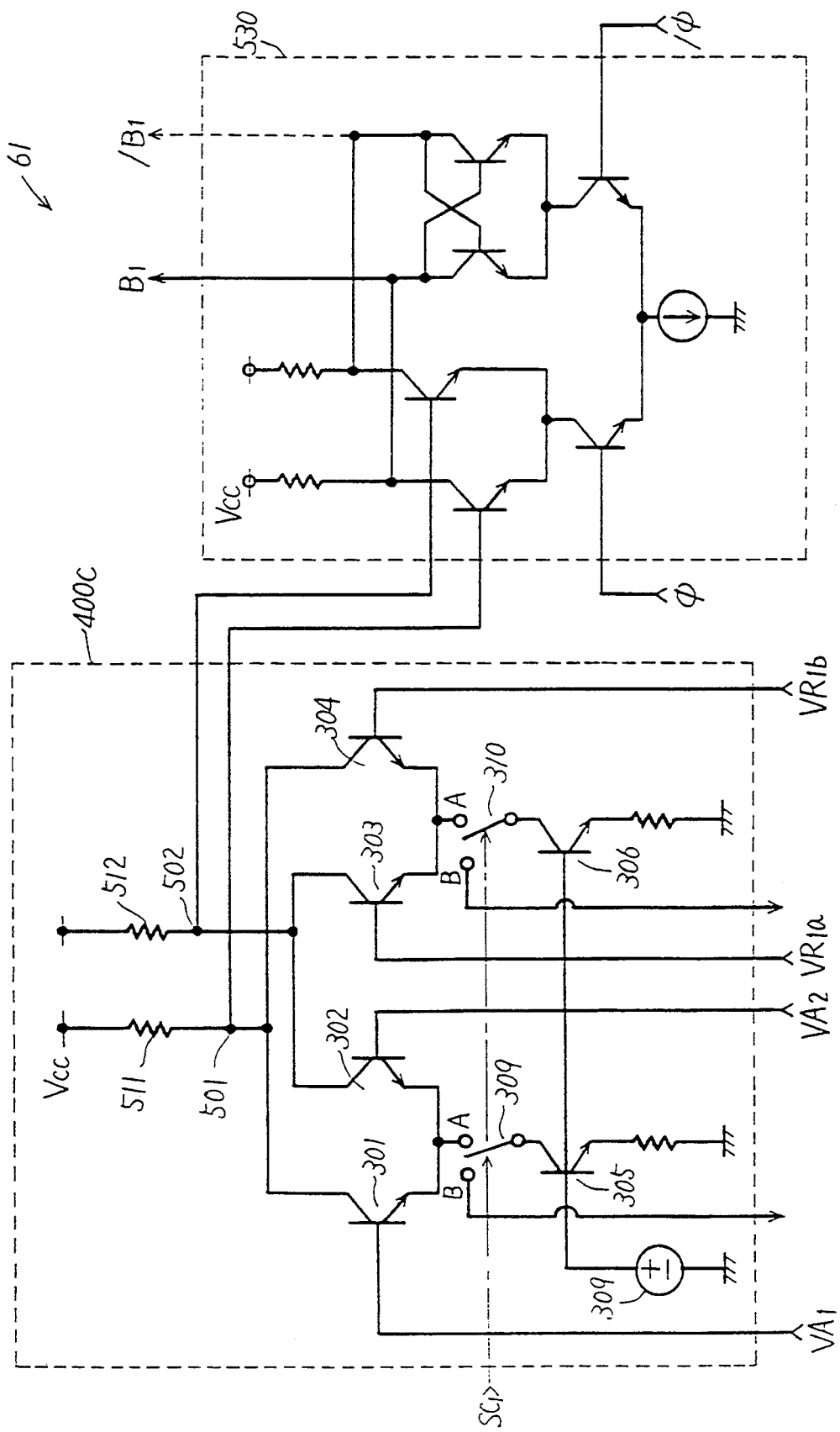
FIG. 9 is a circuit diagram of a comparator showing still further embodiment of the present invention.

FIG. 9 is a circuit diagram of a comparator according to still further embodiment of the present invention. With reference to FIG. 9, a differential amplifier circuit 400c differs from the circuit 400 shown in FIG. 4 in that it includes switching elements 309 and 310 for avoiding waste of current to be consumed. In other words, the switching element 309 is connected between the emitters of the transistors 301 and 302 and the collector of the transistor 305. The switching element 310 is connected between the emitters of the transistors 303 and 304 and the collector of the transistor 306. The switching elements 309 and 310 are controlled in response to a switching control signal SC1 (generated, for example, from the timing signal generator 6 shown in FIG. 2). The remaining part of the circuit structure is the same as that of the circuit 400 shown in FIG. 4, of which no description is given herein.

In operation, when the differential amplifier circuit 400c is operated, the switching elements 309 and 310 are connected to the terminal A in response to a switching control signal SC1. As a result, the same circuit as the circuit 400 shown in FIG. 4 is constituted to perform the same operation. On the other hand, when the differential amplifier circuit 400c is not operated, the switching elements 309 and 310 are connected to B in response to the signal SC1. As a result, an output current of each constant current source can be supplied to the other circuits (not shown). In other words, the switching elements 309 and 310 avoid waste of current to be consumed in the differential amplifier circuit 400c, thereby making use of the constant current sources.

Although the differential amplifier circuits used in the above embodiments are symmetrical in circuit characteristics, such characteristic is not always necessary as is clear from the foregoing description. In addition, this is also the case with the above-described "monotony". It is enough to obtain "monotony" in the range of VA1−VA2 to be compared with. It is therefore pointed out that the present invention is applicable in a case, for example, where npn transistors constituting a differential amplifier circuit have emitters of the different sizes and where constant current sources to be used have different output current values. In the following, a differential amplifier circuit not "symmetrical" in circuit characteristics will be described.

Consideration is given, for example, to a case where a voltage difference VA1−VA2 or VR1a−VR1b to be compared is not fully amplified. A linear expansion of the functions f1(x) and f2(x) of equation (11) with x which is proximate to 0, obtains the following relationship.

$$I10-I20 = 2 \cdot f1\ (0) + 2 \cdot Gm1\ (VA1-VA2) - 2 \cdot f2\ (0) - 2 \cdot Gm2\ (VR1a-VR1b) \quad (15)$$

Herein, Gm1 and Gm2 denote differential coefficients of the functions f1(x) and f2(x) when x is 0, that is, they denote shunt sensitivity.

Assuming that a differential amplifier circuit has "complementarity" and "symmetricalness", equations (9) and (10) are established to obtain the following equation.

$$I10-I20 = 2Gm1 \cdot \{(VA1-VA2)-(Gm2/Gm1) \cdot (VR1a-VR1b)\} \quad (16)$$

Thus, a difference between the currents I10 and I20 is determined according to a difference between the input voltage difference VA1−VA2 and a value Gm2/Gm1 times the input voltage difference VR1a−VR1b. Even if the circuit lacks "symmetricalness" in circuit characteristics, the circuit may be structured so as to delete f1(0) and f2(0) from equation (15). One example thereof is shown in FIG. 10.

Figure 10:
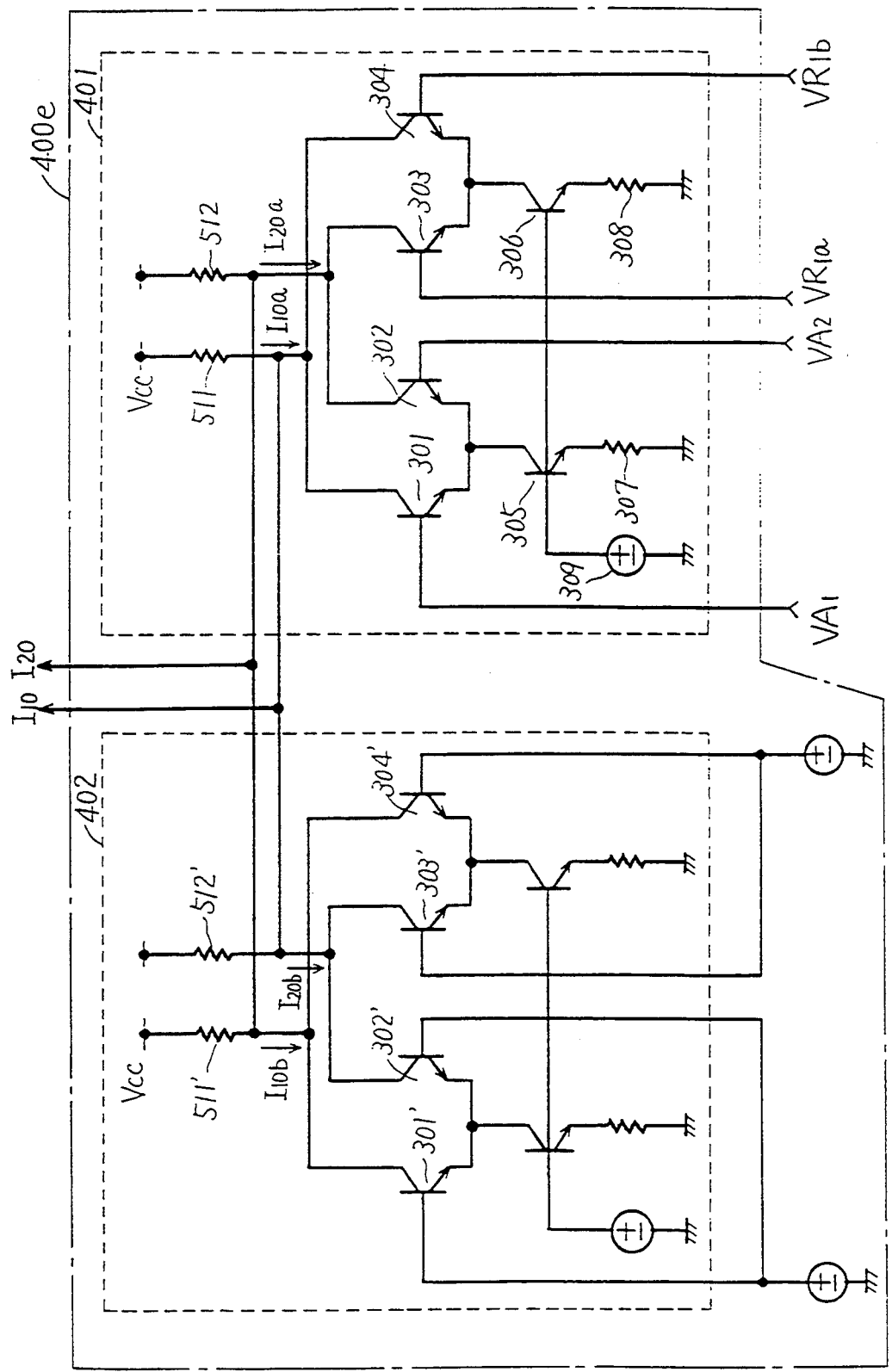
FIG. 10 is a circuit diagram of a differential amplifier circuit according to still further embodiment of the present invention.

FIG. 10 is a circuit diagram of a differential amplifier circuit according to still further embodiment of the present invention. With reference to FIG. 10, a differential amplifier circuit 400e includes an original differential amplifier circuit 401 and an additional differential amplifier circuit 402 having the same circuit characteristics as those of the circuit 401. The differential amplifier circuit 401, similarly to the circuit 400 shown in FIG. 4, receives complementary or differential input voltages VA1 and VA2 and reference voltages VR1a and VR1b. As a result, the same relationship is established as equation (15).

$$I10-I20 = 2 \cdot f1\ (0) + 2 \cdot Gm1\ (VA1-VA2) - 2 \cdot f2\ (0) - 2 \cdot Gm2\ (VR1a-VR1b) \quad (17)$$

On the other hand, in the differential amplifier circuit 402, the bases of transistors 301' and 302' are connected with each other and the bases of transistors 303' and 304' are connected with each other, whereby the following relationship is established.

$$I10-I20 = 2 \cdot f1\ (0) - 2 \cdot f2\ (0) \quad (18)$$

With the respective output terminals of the differential amplifier circuits 401 and 402 connected with each other as shown in FIG. 10, a difference between output currents I10 and I20 of the differential amplifier circuit 400e can be obtained by the following equation.

$$\begin{aligned} I10 - I20 &= (I10a + I20b) - (I20a + I10b) \\ &= (I10a - I20a) - (I10b + I20b) \end{aligned} \quad (19)$$

It can be seen that the same result as that from equation (16) is derived from equations (17), (18) and (19). Therefore, "symmetricalness" is not always necessary in a differential amplifier circuit to be used. In addition thereto, "monotony" is not required for the entire circuit characteristics of the differential amplifier circuit. "Monotonousness" in a range of an input voltage difference to be compared is enough.

Figure 6:
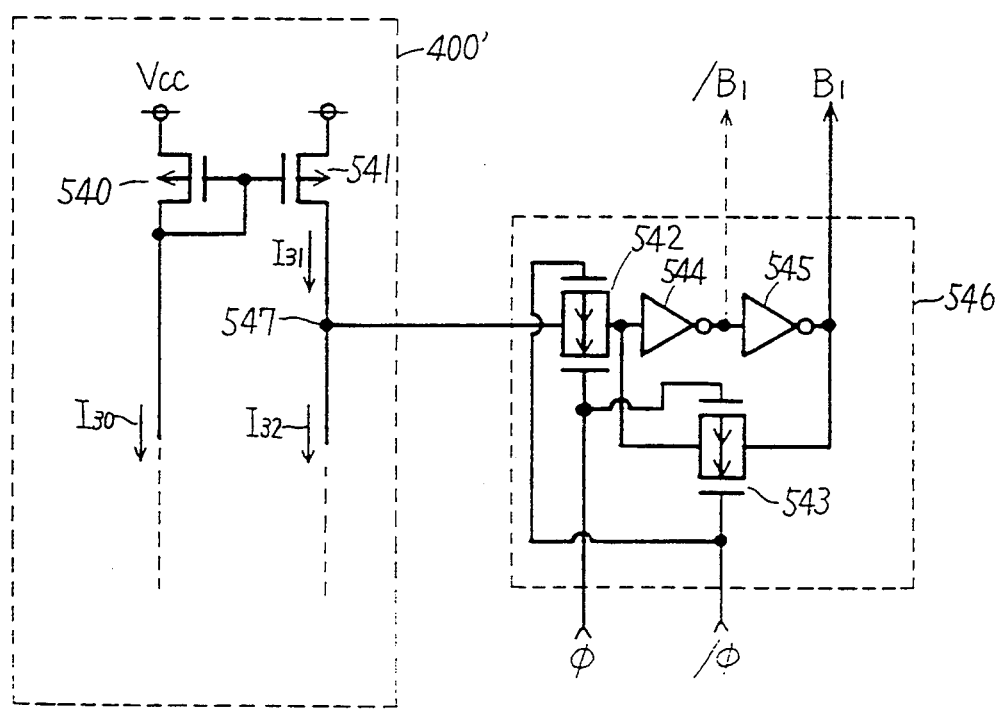
FIG. 6 is a circuit diagram showing another example of the comparator shown in FIG. 2.

FIG. 6 is a circuit diagram showing another example of the binarization circuit shown in FIG. 2. With reference to FIG. 6, a binarization circuit 546 includes transmission gates 542 and 543 and inverters 544 and 545. The inverter 544 is connected to an output node 547 of a differential amplifier circuit 400' through the transmission 542. The transmission gate 543 is connected between the input of the inverter 544 and the output of the inverter 545. Transmission gate 542 and 543 are selectively turned on in response to control signals $\phi$ and $\overline{\phi}$ generated from the timing signal generator 6 shown in FIG. 2.

PMOS transistors 540 and 541 in the differential amplifier circuit 400' constitute a current mirror circuit. The current mirror circuit is equivalent to a load circuit constituted by the resistors 511 and 512 shown in FIG. 4, for example. A current I31 equal to a current I30 flowing through the transistor 540 is conveyed by the current mirror circuit from the drain of the transistor 541 to the node 547. When the current I30 is larger than a current I32, the current I31 flowing to the node 547 becomes larger than a current flowing out of the node 547, thereby increasing a potential of the node 547. The potential difference is binarized by a latch circuit constituted by the inverters 544 and 545.

When the transmission gate 542 is on and the transmission gate 543 is off, the inverter 544 receives the potential of the node 547. An increase in potential of the node 547 is amplified by the inverters 544 and 545 to output a binarization signal B1 (and $\overline{B1}$). Then, when the transmission gate 542 is off and the transmission gate 543 is on, the inverters 544 and 545 form a bistable circuit. The potential of the binarization signal B1 (and $\overline{B1}$) is completely brought to a power source voltage level by the bistable circuit. The state of the bistable circuit is maintained until the transmission gate 542 is subsequently turned on.

Therefore, when the current I30 is larger than the current I32, that is, when the input voltage difference VA1−VA2 is larger than another input voltage difference VR1a−VR1b, a high level binarization signal B1 is output. When a reverse relationship is established, a low level binarization signal B1 is output.

Figure 11:
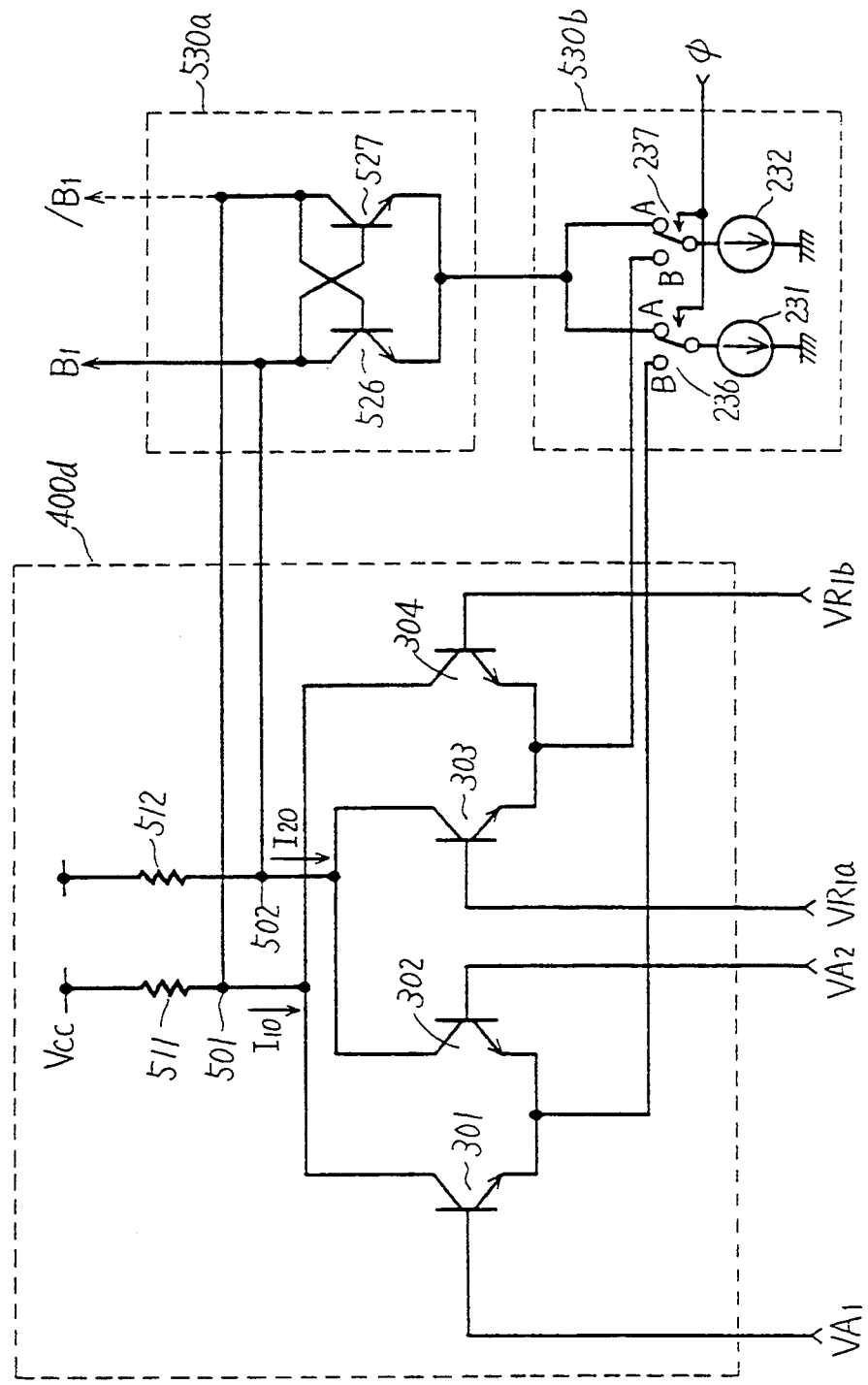
FIG. 11 is a circuit diagram of a comparator according to still further embodiment of the present invention.

FIG. 11 is a circuit diagram of a comparator showing still further embodiment of the present invention. With reference to FIG. 11, in a differential amplifier circuit 400d, a constant current source is replaced by another constant current circuit 530b. A binarization circuit 530a is structured by npn transistors 526 and 527. The base of the transistor 526 is connected to the collector of the transistor 527. The base of the transistor 527 is connected to the collector of the transistor 526. The emitters of the transistors 526 and 527 are connected together to the output of the constant current circuit 530b.

The constant current circuit 530b includes switching elements 236 and 237 operable in response to a switching control signal $\phi$ and constant current sources 231 and 232. Respective terminals A of the switching elements 236 and 237 are connected to the emitters of the transistors 526 and 527. The terminal B of the switching element 236 is connected to emitters of transistors 301 and 302. The terminal B of the switching element 237 is connected to emitters of transistors 303 and 304. Resistors 511 and 512 have the same resistance value.

When the switching elements 236 and 237 are connected to the terminal B in response to the switching control signal $\phi$, the constant current sources 231 and 232 supply a constant current to the differential amplifier circuit 400d. As a result, the differential amplifier circuit 400d operates in the same manner as the circuit 400 shown in FIG. 4. When an output current I10 of the differential amplifier circuit 400d is larger than a current I20, a high level binarization signal B1 and a low level binarization signal $\overline{B1}$ are provided through the binarization circuit 530a.

When the switching elements 236 and 237 are connected to the terminal A in response to the switching control signal $\phi$, the binarization circuit 530a is activated. At this time, the differential amplifier circuit 400d is not activated. As a result, the bistable circuit constituted by the transistors 526 and 527 is operated to maintain the high level binarization signal B1 and the low level binarization signal $\overline{B1}$. The state of the bistable circuit is maintained until the switching elements 236 and 237 are connected to the terminal B. The function of the switching elements 236 and 237 effectively utilize a current provided from the constant current sources 231 and 232, leading to reduction of power consumption.

Figure 12:
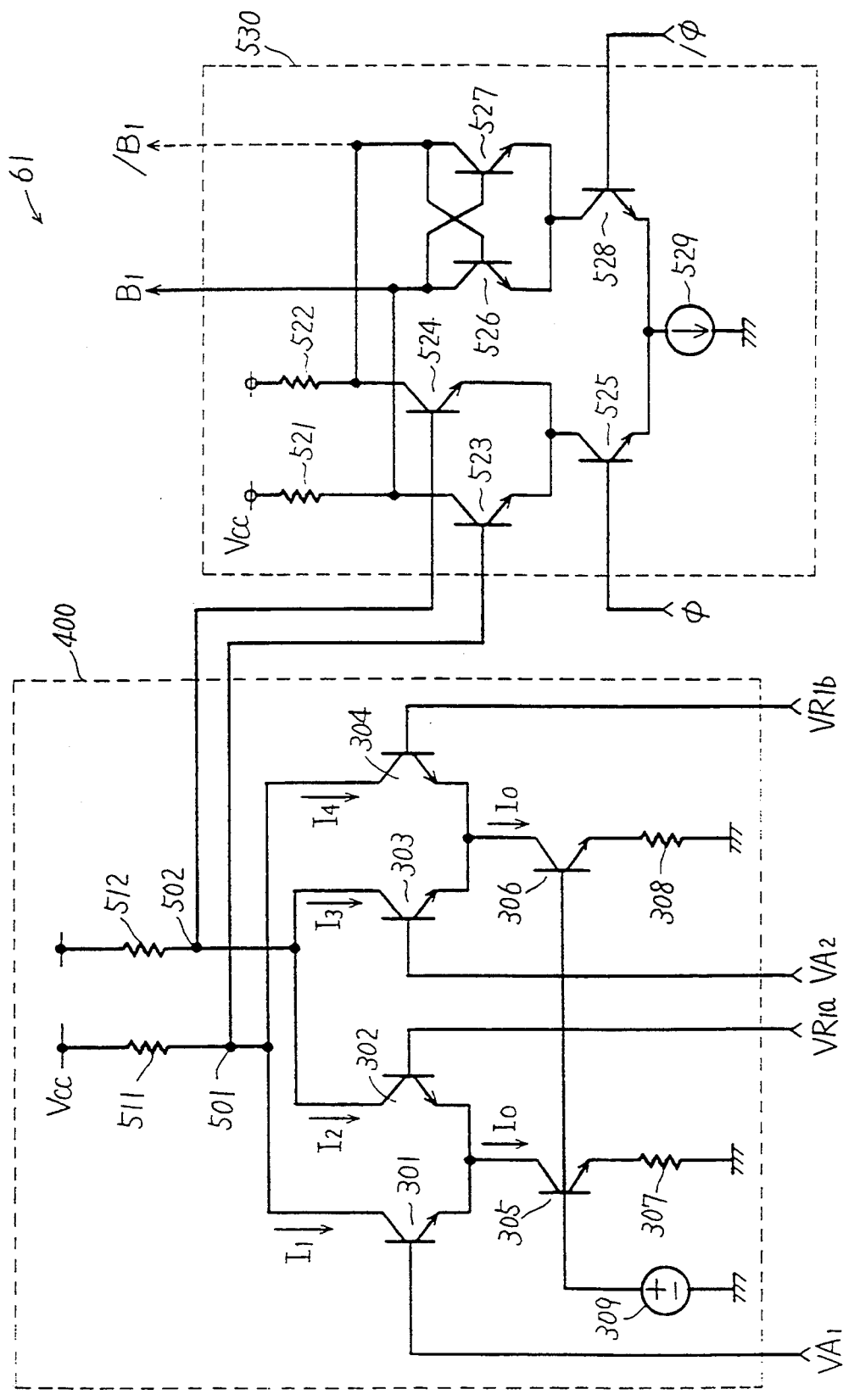
FIG. 12 is a circuit diagram of a comparator according to still further embodiment of the present invention.

FIG. 12 is a circuit diagram showing a comparator of still further embodiment of the present invention. The circuit shown in FIG. 12 is the same in circuit structure but different in a manner of applying the complementary or differential input voltages VA1 and VA2 and reference voltages VR1a and VR1b from that of FIG. 4. In other words, the differential input voltage VA1 is applied to the base of the transistor 301, while the differential input voltage VA2 is applied to the base of the transistor 303. The reference voltage VR1a is applied to the base of the transistor 302 and the reference voltage VR1b is applied to the base of the transistor 304.

While the comparator shown in FIG. 4 achieves high sensitivity as indicated by the curves I1 and I2 shown in FIG. 5, it allows a narrow range of the input voltage difference VA1−VA2. The use of the comparator shown in FIG. 12 can expand an allowable input voltage difference |VA1−VA2|. It is assumed, for example, that a range of the input voltage difference VA1−VA2 applicable to the comparator shown in FIG. 4 is ±30 mV and that 1 V, 0 V, 0.99 V and 0.01 V are respectively applied to the bases of the transistors 301 to 304. Since the range applicable to the comparator shown in FIG. 4 is ±30 mV, an application of the voltage in the above example causes the input voltage difference to be out of the range. An application of the input voltage as shown in FIG. 12, however, enables the difference to be within the above range. In other words, a voltage difference of 10 mV is applied to the circuit structured by the transistors 301 and 302 and a voltage difference of −10 mV is applied to the circuit structured by the transistors 303 and 304. It can be seen that the comparator shown in FIG. 12 is effective when the input voltage difference VA1−VA2 and the reference voltage difference VR1a−VR1b are large.

FIG. 13 is a waveform diagram illustrating operation of the comparator shown in FIG. 12. In FIG. 13, the abscissa represents a time passage and the ordinate represents a change of a voltage (V) or a current (I). FIG. 13(A) shows changes of the complementary or differential input voltages VA1 and VA2 and reference voltages VR1a and VR1b. FIG. 13(B) shows changes of the collector currents I1 to I4 flowing through the transistors 301 to 304, respectively. When the level of the input voltage VA1 is coincident with that of the reference voltage VR1a, the level of the current I1 coincides with that of I2. Similarly, when the level of the input voltage VA2 is coincident with that of the reference voltage VR1b, the level of the current I3 coincides with that of I4. The currents I1 and I2 are added to each other, and the added current flows to the resistor 511. As a result, the voltage V501 at the output node 501 of the differential amplifier circuit 400 is changed as shown in FIG. 13(C). Similarly, the currents I3 and I4 are added to each other and the added current flows to the resistor 512. As a result, the voltage V502 at the output node 502 is changed as shown in FIG. 13(C).

Figure 13A:
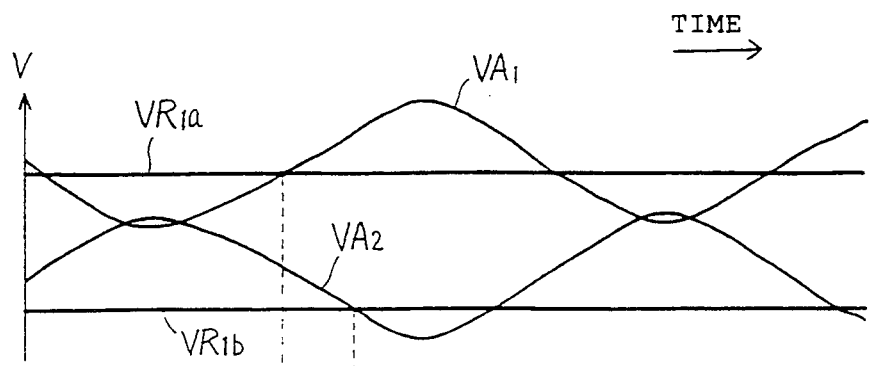
FIGS. 13(A)–(E) are a waveform diagram illustrating operation of the comparator shown in FIG. 12.
Figure 13B:
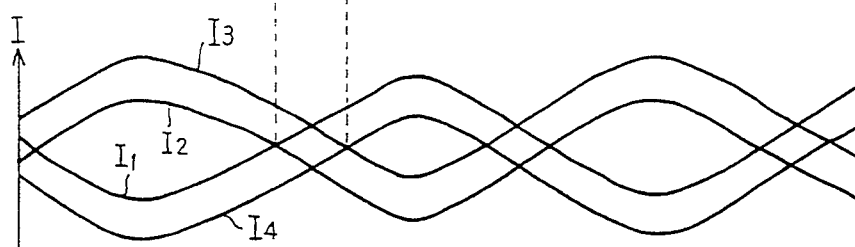
Figure 13C:
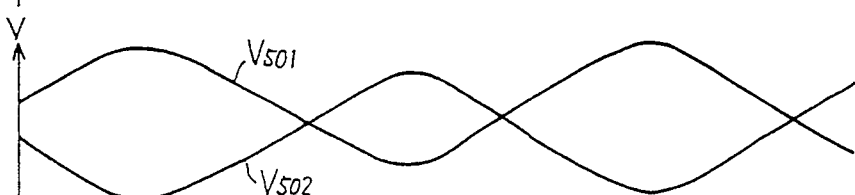
Figure 13D:
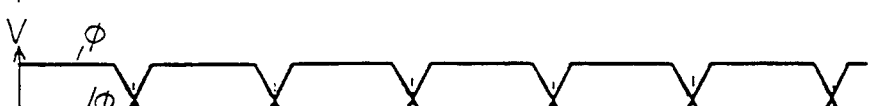
Figure 13E:
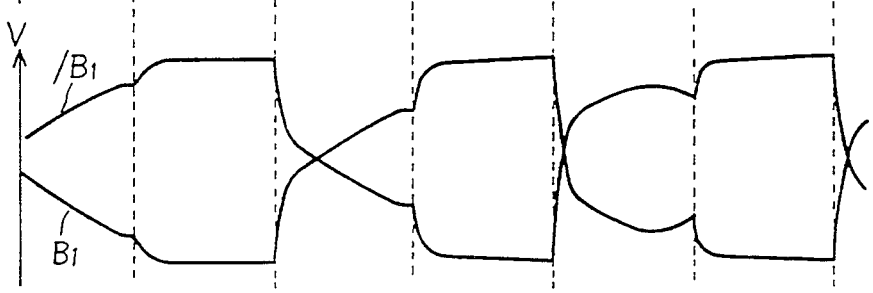

Assuming that the signals $\phi$ and $\overline{\phi}$ shown in FIG. 13(D) are applied as the activation signals $\phi$ and $\overline{\phi}$ for the binarization circuit 530, the binary signals B1 and $\overline{B1}$ shown in FIG. 13(E) are output from the binarization circuit 530. When the activation signal $\phi$ is at a high level, the output current of the constant current source 529 flows to the transistors 523 and 524. As a result, a difference between the output voltages V501 and V502 is amplified to output the binarization signals B1 and $\overline{B1}$ shown in FIG. 13(E). On the other hand, when the activation signal $\overline{\phi}$ is at a high level, the output current of the constant current source 529 flows to the transistors 526 and 527. With the transistors 526 and 527 cross-coupled to each other, the binarization signals B1 and $\overline{B1}$ are held. This state is maintained until the signal $\overline{\phi}$ attains a low level.

Figure 14:
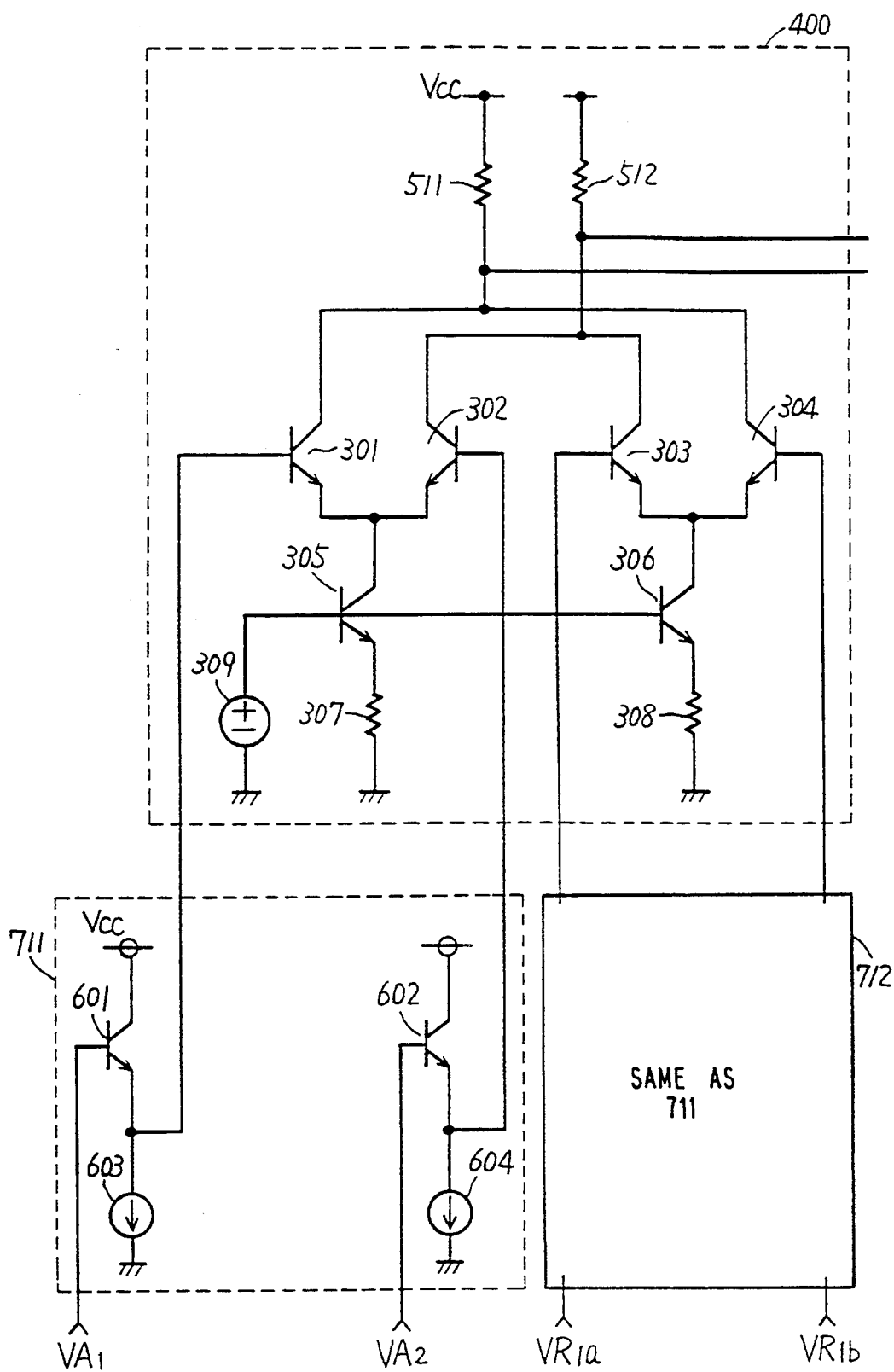
FIG. 14 is a circuit diagram showing one example of an input drive circuit applicable to the embodiments of the present invention.

FIG. 14 is a circuit diagram showing one example of an input drive circuit applicable in the embodiment of the present invention. With reference to FIG. 14, input drive circuits 711 and 712 are provided as circuits preceding to the differential amplifier circuit 400. The input drive circuit 711 includes npn transistors 601 and 602 and constant current sources 603 and 604. The base of the transistor 601 receives an input voltage VA1. The emitter of the transistor 601 is connected to the output of the constant current source 603, thereby forming an emitter follower circuit. The emitter of the transistor 601 is connected to the base of the transistor 301 in the differential amplifier circuit 400. The base of the transistor 602 receives an input voltage VA2. The emitter of the transistor 602 is connected to the output of the constant current source 604, thereby forming an emitter follower circuit. The emitter of the transistor 602 is connected to the base of the transistor 302. The input drive circuit 712 receives reference voltages VR1a and VR1b. The input drive circuit 712 has the same circuit structure as that of the circuit 711 and therefore no description is given thereto.

In general, base-emitter voltage $V_{BE}$ of a transistor is substantially maintained constant with a fixed emitter current. Since the constance current sources 603 and 604 are provided, the input voltage difference VA1−VA2 is applied, as a voltage difference between the bases of the transistors 301 and 302, to the differential amplifier circuit 400. The use of the input drive circuits 711 and 712 obtains current supply sufficient for driving the differential amplifier circuit 400. Although the input drive circuits 711 and 712 shown in FIG. 14 are comprised of the bipolar transistors 601 and 602, it is noted that a similar circuit can be structured by a source follower circuit including a field effect transistor.

Figure 15:
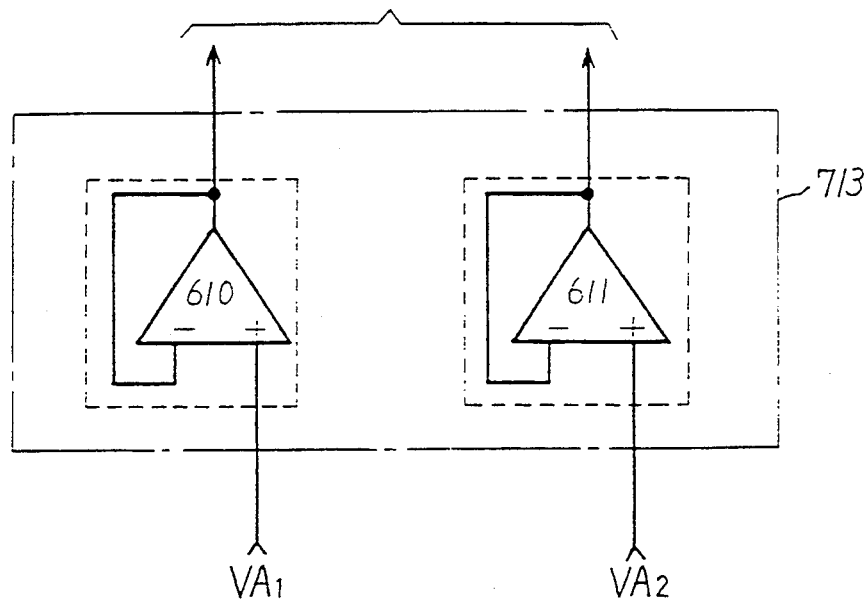
FIG. 15 is a circuit diagram showing another example of the input drive circuit applicable to the embodiments of the present invention.

FIG. 15 is a circuit diagram showing a further example of an input drive circuit applicable to the embodiment of the present invention. With reference to FIG. 15, an input drive circuit 713 includes differential amplifiers 610 and 611. The differential amplifier 610 has an inverted input (−) connected to its output and a non-inverted input (+) for receiving an input voltage VA1. The differential amplifier 611 has an inverted input (−) connected to its output and a non-inverted input (+) for receiving an input voltage VA2. The outputs of the differential amplifiers 610 and 611 are respectively connected to the bases of the transistors 301 and 302 shown in FIG. 14.

With the inverted input (−) of each of the differential amplifiers 610 and 611 connected to the corresponding output, the corresponding input voltage and output voltage coincide with each other. As a result, the input voltage difference VA1−VA2 is applied as a base to base voltage of the transistors 301 and 302. The use of the input drive circuit 713 shown in FIG. 15 can obtain high precision and high current supply capability.

Figure 16:
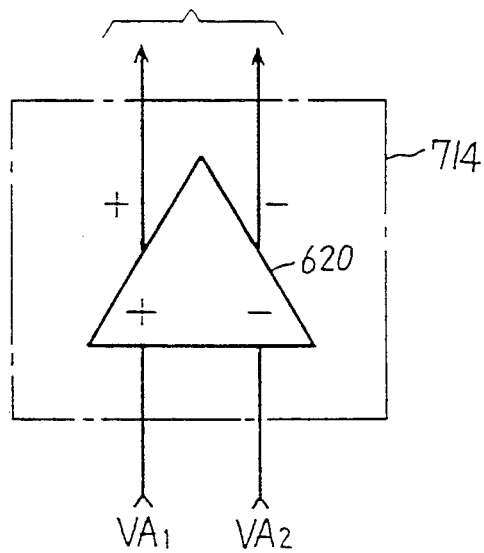
FIG. 16 is a circuit diagram showing a further example of the input drive circuit applicable to the embodiments of the present invention.

FIG. 16 is a circuit diagram showing still further example of an input drive circuit applicable to the embodiment of the present invention. With reference to FIG. 16, an input drive circuit 714 includes a complementary output type differential amplifier 620. The differential amplifier 620 receives input voltages VA1 and VA2 through a positive input (+) and a negative input (−), respectively. The differential amplifier 620 has a positive output (+) and a negative output (−) respectively connected to the bases of the transistors 301 and 302 shown in FIG. 14.

In operation, the complementary output type differential amplifier 620 amplifies the input voltage difference VA1−VA2 and applies the amplified voltage difference to the bases of the transistors 301 and 302. Therefore, the use of the input drive circuit 714 shown in FIG. 16 enables supply of an amplified voltage with high gain to the differential amplifier circuit 400.

Figure 17:
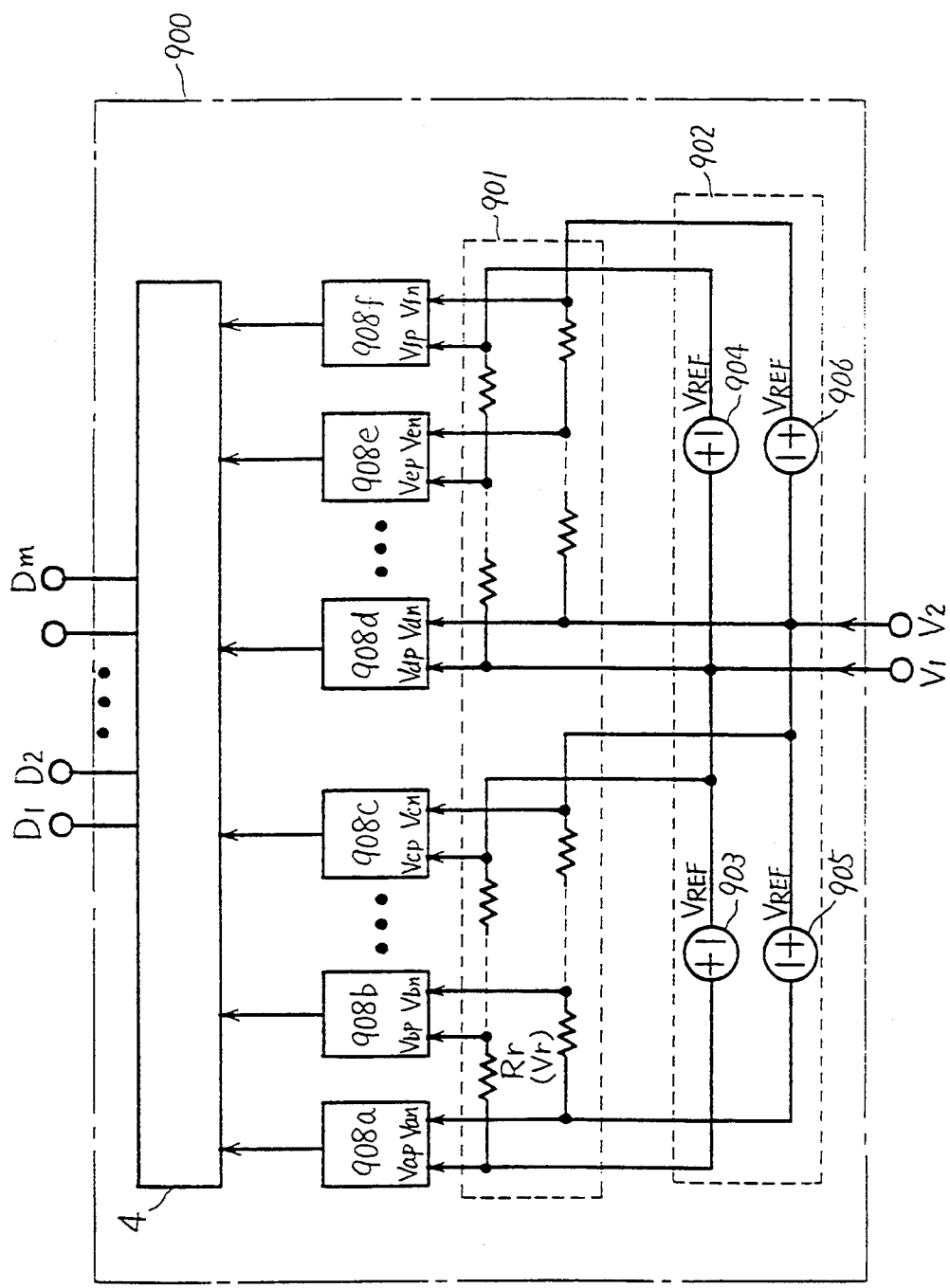
FIG. 17 is a circuit block diagram of a conventional A/D converter.
Figure 18:
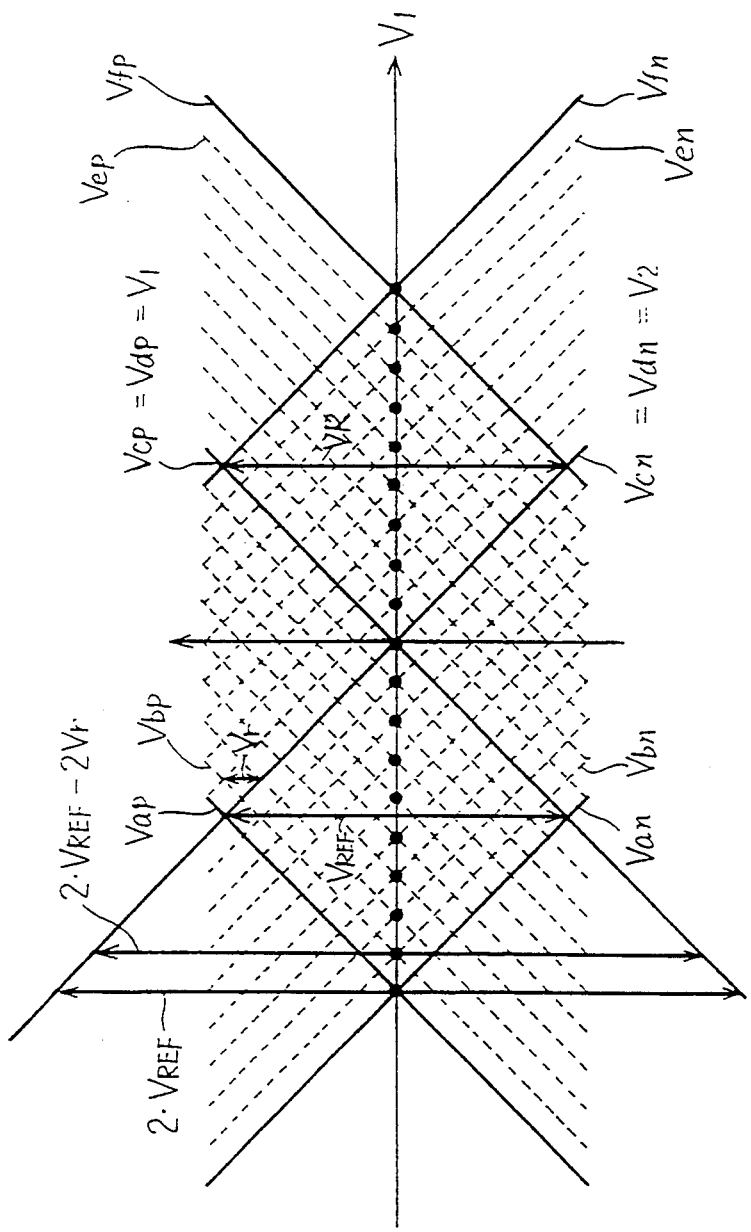
FIG. 18 is a diagram illustrating operation of the A/D converter shown in FIG. 17.

Any of the above-described differential amplifier circuits or comparators are applicable as the comparators 61 to 6n in the A/D converting circuit 15 shown in FIG. 2. In the conventional A/D converter 900 shown in FIG. 17, since analog input voltages V1 and V2 to be converted are applied to the comparators 908a to 908f through the ladder resistor circuit 901, time delay is caused in transmission of the analog input voltages V1 and V2. In the present invention, however, the comparators 61 to 6n directly receive the analog input voltages VA1 and VA2 to be converted through none of resistance elements or components. This prevents delay in a change of the analog input voltages VA1 and VA2 to be transmitted to the respective comparators 61 to 6n.

Although in the foregoing embodiments, the differential amplifier circuits are constituted by using bipolar transistors, it is noted that a differential amplifier circuit having a similar circuit structure can be formed by using field effect transistors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A differential amplifier comprising:
 a first constant current source for conducting a flow of a first predetermined constant current,
 a second constant current source for conducting a flow of a second predetermined constant current,
 increasing current supplying means responsive to an analog input signal for supplying an increasing current to said first constant current source,
 decreasing current supplying means responsive to another analog input signal for supplying a decreasing current to said first constant current source,
  said first predetermined constant current being a sum of said increasing current and said decreasing current,
 first constant current supplying means responsive to a first applied reference voltage for supplying a third predetermined constant current to said second constant current source,
 second constant current supplying means responsive to a second applied reference voltage for supplying a fourth predetermined constant current to said second constant current source,
  said second predetermined constant current being a sum of said third and fourth constant currents,
 first load means having one end connected to a power source potential and the other end connected to said increasing current supplying means and said second constant current supplying means, and
 second load means having one end connected to the power source potential and the other end connected to said decreasing current supplying means and said first constant current supplying means, wherein a differential output voltage is output through the other ends of each of said first and second load means.

2. The differential amplifier according to claim 1, wherein
 said analog input signal includes first differential input voltage and said another input signal includes second differential input voltage,
 said increasing current supplying means includes first proportional current supplying means responsive to the first differential input voltage for supplying, to said first constant current source, a current proportional to said first differential input voltage, and said decreasing current supplying means includes second proportional current supplying means responsive to the second differential input voltage for supplying, to said second constant current source, a current proportional to said second differential input voltage.

3. The differential amplifier according to claim 2, wherein said first proportional current supplying means includes a first transistor connected between the other end of said first load means and the output node of said first constant current source, said first transistor having a control electrode connected to receive the first differential input voltage, and said second proportional current supplying means includes a second transistor connected between the other end of said second load means and the output node of said first constant current source, said second transistor having a control electrode connected to receive the second differential input voltage.

4. The differential amplifier according to claim 3, wherein said first transistor includes a first bipolar transistor, a base-emitter voltage of said first bipolar transistor being changed in response to said first differential input voltage, and said second transistor includes a second bipolar transistor, a base-emitter voltage of said second bipolar transistor being changed in response to said second differential input voltage.

5. The differential amplifier according to claim 2, wherein said first constant current supplying means includes third proportional current supplying means for supplying, to said second constant current source, a current proportional to said first applied reference voltage and said second constant current supplying means includes fourth proportional current supplying means for supplying, to said second constant current source, a current proportional to said third applied reference voltage.

6. The differential amplifier according to claim 5, wherein said third proportional current supplying means includes a third transistor connected between the other end of said second load means the output node of said second constant current source, said third transistor having a control electrode connected to receive said first applied reference voltage, and said fourth proportional current supplying means includes a fourth transistor connected between the other end of said first load means and the output node of said second constant current source, said fourth transistor having a control electrode connected to receive said second applied reference voltage.

7. The differential amplifier according to claim 6, wherein said third transistor is a third bipolar transistor, a base-emitter voltage of said third bipolar transistor being determined by said first applied reference voltage, and said fourth transistor is a fourth bipolar transistor, a base-emitter voltage of said fourth bipolar transistor being determined by said second applied reference voltage.

8. A differential amplifier comprising:

a first constant current source for conducting a flow of a first predetermined constant current, a second constant current source for conducting a flow of a second predetermined constant current, increasing current supplying means responsive to an analog input signal for supplying an increasing current to said first constant current source, decreasing current supplying means responsive to another analog input signal for supplying a decreasing current to said first constant current source, said first predetermined constant current being a sum of said increasing current and said decreasing current, first constant current supplying means responsive to a first applied reference voltage for supplying a third predetermined constant current to said second constant current source, second constant current supplying means responsive to a second applied reference voltage for supplying a fourth predetermined constant current to said second constant current source, said second predetermined constant current being a sum of said third and fourth constant currents, first load means having one end connected to a power source potential and the other end connected to said increasing current supplying means and said second constant current supplying means, second load means having one end connected to the power source potential and the other end connected to said decreasing current supplying means and said first constant current supplying means, wherein a differential output voltage is output through the other ends of each of said first and second load means, and proportional range expanding means for expanding a range of a difference between said first and second differential input voltages wherein currents applied by said first and second proportional current supplying means can be proportional to each other, wherein said analog input signal includes first and second differential input voltages, said increasing current supplying means includes first proportional current supplying means responsive to the first differential input voltage for supplying, to said first constant current source, a current proportional to said first differential input voltage, and said decreasing current supplying means includes second proportional current supplying means responsive to the second differential input voltage for supplying, to said second constant current source, a current proportional to said second differential input voltage.

9. The differential amplifier according to claim 8, wherein said proportional range expanding means includes:

first resistor means connected between said first proportional current supplying means and an output node of said first constant current source, and second resistor means connected between said second proportional current supplying means and the output node of said first constant current source.

10. The differential amplifier according to claim 8, wherein said proportional range extending means includes third resistor means connected between the output nodes of said first and second proportional current supplying means.

11. A differential amplifier comprising:
a first constant current source for conducting a flow of a first predetermined constant current,
a second constant current source for conducting a flow of a second predetermined constant current,
increasing current supplying means responsive to an analog input signal for supplying an increasing current to said first constant current source,
decreasing current supplying means responsive to the analog input signal for supplying a decreasing current to said first constant current source,
said first predetermined constant current being a sum of said increasing current and said decreasing current,
first constant current supplying means responsive to a first applied reference voltage for supplying a third predetermined constant current to said second constant current source,
second constant current supplying means responsive to a second applied reference voltage for supplying a fourth predetermined constant current to said second constant current source,
said second predetermined constant current being a sum of said third and fourth constant currents,
first load means having one end connected to a power source potential and the other end connected to said increasing current supplying means and said second constant current supplying means,
second load means having one end connected to the power source potential and the other end connected to said decreasing current supplying means and said first constant current supplying means, wherein a differential output voltage is output through the other ends of each of said first and second load means, and
first switching means connected between said increasing current supplying means, said decreasing current supplying means and said first constant current source and operable in response to an applied control signal.

12. A comparator comprising
a differential amplifier including;
a first constant current source for conducting a flow of a first predetermined constant current,
a second constant current source for conducting a flow of a second predetermined constant current,
increasing current supplying means responsive to an analog input signal for supplying an increasing current to said first constant current source,
decreasing current supplying means responsive to the analog input signal for supplying a decreasing current to said first constant current source,
said first predetermined constant current being a sum of said increasing current and said decreasing current,
first constant current supplying means responsive to another first applied reference voltage for supplying a third predetermined constant current to said second constant current source,
second constant current supplying means responsive to a second applied reference voltage for supplying a fourth predetermined constant current to said second constant current source,
said second predetermined constant current being a sum of said third and fourth constant currents,
first load means having one end connected to a power source potential and the other end connected to said increasing current supplying means and said second constant current supplying means, and
second load means having one end connected to the power source potential and the other end connected to said decreasing current supplying means, wherein a differential output voltage is output through the other ends of each of said first and second load means, and
binarizing means responsive to a differential output signal output from said differential amplifier for generating a binarization signal.

13. The comparator according to claim 12, wherein said binarizing means includes latch circuit means for latching the differential output signal output from said differential amplifier.

14. The comparator according to claim 13, wherein said binarizing means includes differential output amplifying means for amplifying the differential output signal output from said differential amplifier, and
said latch circuit means latches a signal amplified by said differential output amplifying means.

15. The comparator according to claim 14, wherein said binarizing means further includes selectively activating means responsive to an activation control signal for selectively activating one of said latch circuit means and said differential output amplifying means.

16. An A/D converter comprising:
differential signal generating means responsive to an analog input signal and another analog input signal for generating first and second differential signals,
reference voltage generating means for generating first and second reference voltages for defining a predetermined larger potential difference and third and fourth reference voltages for defining a predetermined smaller potential difference,
first comparator means for comparing a voltage difference between the first and the second differential signals with a difference between the first and the second reference voltages, and
second comparator means for comparing the voltage difference between the first and the second differential signals with a difference between the third and the fourth reference voltages, each of said first and second comparator means including:
a differential amplifier comprising:
a first constant current source for conducting a flow of a first predetermined constant current,
a second constant current source for conducting a flow of a second predetermined constant current,
increasing current supplying means responsive to the analog input signal for supplying an increasing current to said first constant current source,
decreasing current supplying means responsive to the another analog input signal for supplying a decreasing current to said first constant current source, said first predetermined constant current being a sum of said increasing current and said decreasing current, first constant current supplying means responsive to a first applied reference voltage for supplying a third predetermined constant current to said second constant current source, second constant current supplying means responsive to a second applied reference voltage for supplying a fourth predetermined constant current to said second constant current source, said second predetermined constant current being a sum of said third and fourth constant currents, first load means having one end connected to a power source potential and the other end connected to said increasing current supplying means and said second constant current supplying means, and second load means having one end connected to the power source potential and the other end connected to said decreasing current supplying means, wherein a differential output voltage is output through the other ends of each of said first and second load means, and binarizing means responsive to a differential output signal output from said differential amplifier for generating a binarization signal.

17. An A/D converter comprising:

differential signal generating means responsive to an analog input signal and another analog input signal for generating first and second differential signals, reference voltage pair generating means for generating at least one reference voltage pair whose voltage difference is sequentially reduced, and at least one comparator means each for receiving said first and second differential signals and corresponding one of said at least one reference voltage pairs and comparing a voltage difference between said first and second differential signals with a voltage difference between the voltages of said corresponding reference voltage pair, each of said at least one comparator means including:

a differential amplifier comprising:
  a first constant current source for conducting a flow of a first predetermined constant current,
  a second constant current source for conducting a flow of a second predetermined constant current,
  increasing current supplying means responsive to the analog input signal for supplying an increasing current to said first constant current source,
  decreasing current supplying means responsive to the another analog input signal for supplying a decreasing current to said first constant current source,
  said first predetermined constant current being a sum of said increasing current and said decreasing current,
  first constant current supplying means responsive to a first applied reference voltage for supplying a third predetermined constant current to said second constant current source,
  second constant current supplying means responsive to a second applied reference voltage for supplying a fourth predetermined constant current to said second constant current source,
  said second predetermined constant current being a sum of said third and fourth constant currents,
  first load means having one end connected to a power source potential and the other end connected to said increasing current supplying means and said second constant current supplying means, and
  second load means having one end connected to the power source potential and the other end connected to said decreasing current supplying means, wherein a differential output voltage is output through the other ends of each of said first and second load means, and
binarizing means responsive to a differential output signal output from said differential amplifier for generating a binarization signal.

18. The A/D converter according to claim 17, wherein said at least one comparator means output a thermometer code signal, said A/D converter further including encoder means for converting the thermometer code signal output from said at least one comparator means into a binary signal.

19. A differential amplifier including:

a first constant current source for conducting a flow of a first predetermined constant current, a second constant current source for conducting a flow of a second predetermined constant current, increasing current supplying means responsive to an analog input signal for supplying an increasing current to said first constant current source, first compensation current supplying means for supplying a first compensation current to said first constant current source, decreasing current supplying means responsive to another analog input signal for supplying a decreasing current to said first constant current source, second compensation current supplying means for supplying a second compensation current to said second constant current source, first load means having one end connected to a power source potential and the other end connected to said increasing current supplying means and said second compensation current supplying means, and second load means having one end connected to the power source potential and the other end connected to said decreasing current supplying means and said first compensation current supplying means, wherein a differential output voltage representing a difference between the analog input signal and the another analog input signal is output through an output end of each of said first and second load means.

20. The differential amplifier according to claim 19, wherein said analog input signal are first differential input voltage and said another input signal includes second differential input voltage, said increasing current supplying means includes first proportional current supplying means responsive to the first differential input voltage for supplying, to said first constant current source, a current proportional to said first differential input voltage, and said decreasing current supplying means includes second proportional current supplying means responsive to the second differential input voltage for supplying, to said second constant current source, a current proportional to said second differential input voltage.

21. The differential amplifier according to claim 20, wherein said first proportional current supplying means includes a first transistor connected between the other end of said first load means and an output node of said first constant current source, said first transistor having a control electrode connected to receive the first differential input voltage, and said second proportional current supplying means includes a second transistor connected between the other end of said second load means and an output node of said second constant current source, said second transistor having a control electrode connected to receive the second differential input voltage.

22. The differential amplifier according to claim 21, wherein said first transistor is a first bipolar transistor, a base-emitter voltage of said first bipolar transistor being changed in response to said first differential input voltage, and said second transistor is a second bipolar transistor, a base-emitter voltage of said second bipolar transistor being changed in response to said second differential input voltage.

23. The differential amplifier according to claim 20, wherein said first compensation current supplying means includes a third transistor connected between the other end of said second load means and an output node of said first constant current source, said third transistor having a control electrode connected to receive a first applied reference voltage, and said second compensation current supplying means includes a fourth transistor connected between the other end of said first load means and an output node of said second constant current source, said fourth transistor having a control electrode connected to receive a second applied reference voltage.

24. The differential amplifier according to claim 23, wherein said third transistor is a third bipolar transistor, a base-emitter voltage of said third bipolar transistor being determined by said first applied reference voltage, and said fourth transistor is a fourth bipolar transistor, a base-emitter voltage of said fourth bipolar transistor being determined by said second applied reference voltage.

25. A comparator comprising:

a differential amplifier including:
a first constant current source for conducting a flow of a first predetermined constant current,
a second constant current source for conducting a flow of a second predetermined constant current,
increasing current supplying means responsive to an analog input signal for supplying an increasing current to said first constant current source,
first compensation current supplying means for supplying a first compensation current to said first constant current source,
decreasing current supplying means responsive to another analog input signal for supplying the decreasing current to said second constant current source,
second compensation current supplying means for supplying a second compensation current to said second constant current source,
first load means having one end connected to a power source potential and the other end connected to said increasing current supplying means and said second compensation current supplying means, and
second load means having one end connected to a power source potential and the other end connected to said decreasing current supplying means and said first compensation current supplying means, wherein a differential output voltage representing a difference between the analog input signal and the another analog input signal is output through an output end of each of said first and second load means, and binarizing means responsive to a differential output signal output from said differential amplifier for generating a binary signal.

26. An A/D converter comprising:

differential signal generating means responsive to an analog input signal and another analog input signal for generating first and second differential signals, reference voltage pair generating means for generating first and second reference voltages for defining a predetermined larger potential difference and third and fourth reference voltages for defining a predetermined smaller potential difference, first comparator means each for comparing a voltage difference between the first and the second differential signals with a difference between the first and the second reference voltages, and second comparator means for comparing the voltage difference between the first and the second differential signals with a difference between the third and the fourth reference voltages, each of said first and second comparator means including:

a differential amplifier including:
a first constant current source for conducting a flow of a first predetermined constant current,
a second constant current source for conducting a flow of a second predetermined constant current,
increasing current supplying means responsive to the analog input signal for supplying an increasing current to said first constant current source,
first compensation current supplying means for supplying a first compensation current to said first constant current source,
decreasing current supplying means responsive to the another analog input signal for supplying the decreasing current to said second constant current source,
second compensation current supplying means for supplying a second compensation current to said second constant current source,
first load means having one end connected to a power source potential and the other end connected to said increasing current supplying means and said second compensation current supplying means, and
second load means having one end connected to a power source potential and the other end connected to said decreasing current supplying means and said first compensation current supplying means, wherein a differential output voltage representing a difference between the analog input signal and the another analog input signal is output through an output end of each of said first and second load means, and binarizing means responsive to a differential output signal output from said differential amplifier for generating a binary signal.

27. An A/D converter comprising:
differential signal generating means responsive to an analog input signal and another analog input signal for generating first and second differential signals,
reference voltage pair generating means for generating at least one reference voltage pair whose voltage difference is sequentially reduced, and
at least one comparator means each for receiving said first and second differential signals and a corresponding one of said at least one reference voltage pairs and comparing a voltage difference between said first and second differential signals with a voltage difference between the voltages of said corresponding reference voltage pair, each of said at least one comparator means including:
a differential amplifier including:
a first constant current source for conducting a flow of a first predetermined constant current,
a second constant current source for conducting a flow of a second predetermined constant current,
increasing current supplying means responsive to the analog input signal for supplying an increasing current to said first constant current source,
first compensation current supplying means for supplying a first compensation current to said first constant current source,
decreasing current supplying means responsive to the another analog input signal for supplying the decreasing current to said second constant current source,
second compensation current supplying means for supplying a second compensation current to said second constant current source,
first load means having one end connected to a power source potential and the other end connected to said increasing current supplying means and said second compensation current supplying means, and
second load means having one end connected to a power source potential and the other end connected to said decreasing current supplying means and said first compensation current supplying means, wherein a differential output voltage representing a difference between the analog input signal and the another analog input signal is output through an output end of each of said first and second load means, and
binarizing means responsive to a differential output signal output from said differential amplifier for generating a binary signal.

28. A differential amplifier, comprising:
first and second constant current sources,
first and second compensation current supplying means for supplying first and second compensation currents to said first and second constant current sources respectively, and said first and second compensation current supplying means receiving first and second reference signals respectively,
increasing current supplying means, responsive to a first analog input signal, for supplying an increasing current to said first constant current source,
decreasing current supplying means responsive to a second analog input signal for supplying a decreasing current to said first constant current source,
first load means, connected to a power source potential, connected to said increasing current supplying means and connected to said second compensation current supplying means, for providing a first differential output voltage responsive to said first and second analog input signals, and
second load means, connected to the power source potential, connected to said decreasing current supplying means and connected to said first compensation current supplying means, for providing a second differential output voltage responsive to said first and second reference signals.

29. A differential amplifier according to claim 28,
wherein the increasing and decreasing currents each include first and second currents, and
wherein a relationship between the first and second currents is changed according to at least one of: a first difference between the first and second input signals, a second difference between the first and second reference signals, a third difference between the first input and reference signals, and a fourth difference between the second input and reference signals.

* * * * *